(12) United States Patent
McDonald et al.

(10) Patent No.: US 12,130,425 B2
(45) Date of Patent: Oct. 29, 2024

(54) SYSTEMS AND APPARATUS FOR MICROMIRROR DESIGNS WITH ELECTRODE CONTACT

(71) Applicant: Texas Instruments Incorporated, Dallas, TX (US)

(72) Inventors: William Craig McDonald, Allen, TX (US); Ryan Patrick Savage, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 479 days.

(21) Appl. No.: 17/466,775

(22) Filed: Sep. 3, 2021

(65) Prior Publication Data

US 2023/0070502 A1 Mar. 9, 2023

(51) Int. Cl.
*G02B 26/08* (2006.01)
*B81B 3/00* (2006.01)
*G09G 3/34* (2006.01)

(52) U.S. Cl.
CPC ........ *G02B 26/0841* (2013.01); *B81B 3/0035* (2013.01); *G09G 3/346* (2013.01); *B81B 2201/042* (2013.01)

(58) Field of Classification Search
CPC .............. G02B 26/0841; B81B 3/0035; B81B 2201/042; B81B 3/001; B81B 3/0013; B81B 2203/058; G09G 3/346
See application file for complete search history.

(56) References Cited

U.S. PATENT DOCUMENTS

| | | | | |
|---|---|---|---|---|
| 6,522,454 B2 * | 2/2003 | Meier | ................ | G02B 26/0841 359/290 |
| 2003/0117686 A1 * | 6/2003 | DiCarlo | ............. | G02B 26/0841 359/291 |

* cited by examiner

*Primary Examiner* — Euncha P Cherry
(74) *Attorney, Agent, or Firm* — Michelle F. Murray; Frank D. Cimino

(57) ABSTRACT

Systems and Apparatus for micromirror designs with electrode contact. In some examples, a micromirror including a mirror, a mirror via coupled to the mirror, a hinge coupled to the mirror via, the hinge including a springtip associated with a first side of the micromirror, the springtip associated with a first terminal, and an electrode associated with the first side of the micromirror, the electrode having a dielectric coating in contact with the springtip, the electrode associated with a second terminal different than the first terminal.

20 Claims, 13 Drawing Sheets

SYSTEMS AND APPARATUS FOR MICROMIRROR DESIGNS WITH ELECTRODE CONTACT

DETAILED DESCRIPTION

Figure 1:
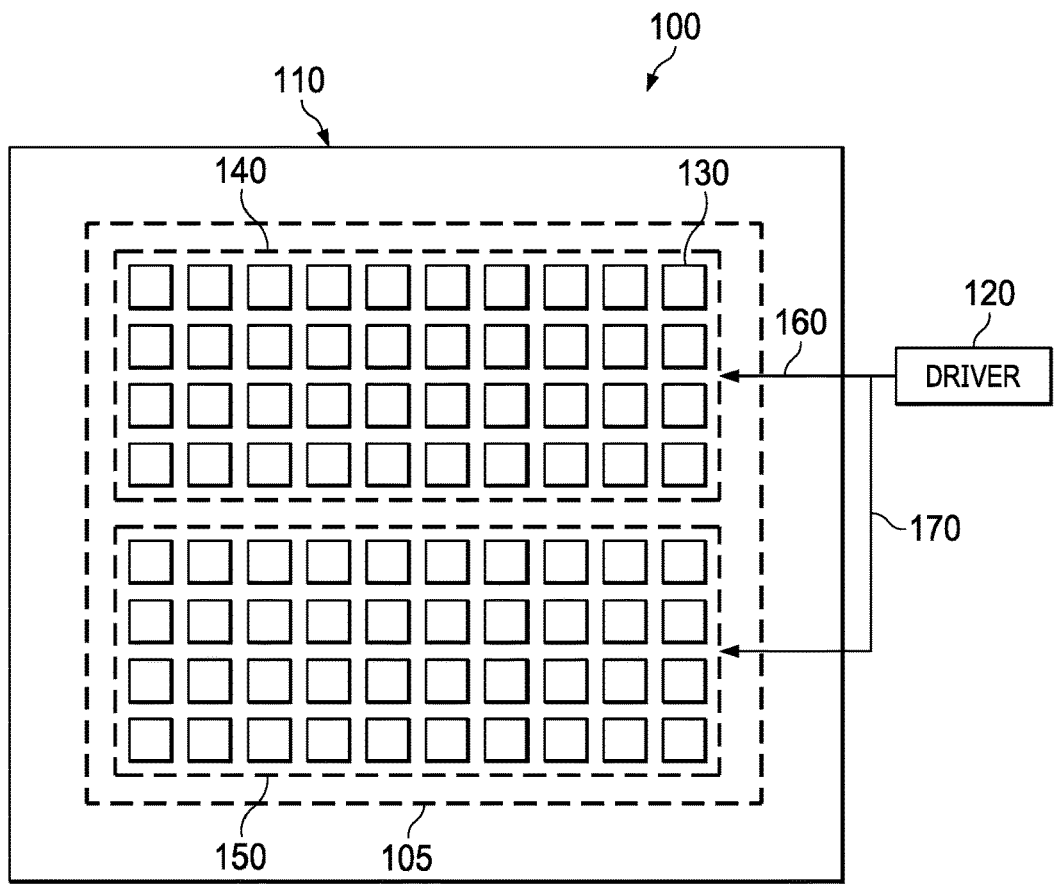
FIG. 1 is a top view illustration of an example display system.

Microelectromechanical system (MEMS) devices including micromirrors, such as digital micromirror devices (DMDs), are utilized in many applications. Such applications may include video projectors, television sets, digital cinema projectors, etc. Each of the micromirrors includes a mirror that tilts between two sides to form images. For example, the two sides of a micromirror are an on side and an off side. The side that the mirror tilts towards is referred to as the landed side. In cases where the mirror is tilted towards the on side, the mirror reflects light toward an image plane (e.g., a display screen). As a result, the on side is the landed side. Alternatively, in cases where the mirror is tilted towards the off side, the mirror reflects light away from the image plane. As a result, the off side is the landed side.

The micromirror may include springtips underlying the mirror on each side. The springtip is an element of the micromirror that allows the mirror to move positions from the on side to the off side, and vice versa. Electrostatic forces provide energy for springtip compression and springtip release. Such electrostatic forces are described below. Springtip compression is an element landing on the springtip caused by a force (hereinafter "compression force"). The element may be a structure in the micromirror. Springtip release is the springtip exerting a force (hereinafter "separating force") on the element. The separating force needs to be large enough to overcome surface adhesion forces between the element and the springtip. The surface adhesion forces are attraction forces between the springtip and the element. Such surface adhesion forces may include capillary forces, chemical forces, Van der Waals forces, electrostatic interfacial forces, etc. In cases where the separating force does not overcome the surface adhesion forces, stiction occurs between the springtip and the element. Stiction is a failure of the springtip and the element to break contact with each other due to the surface adhesion forces.

In some examples, each of the two sides of the micromirror further includes an electrode underlying the mirror. The electrodes may be located between the springtips, and the mirror may land on the springtip associated with the landed side. In this example, the mirror and the springtip associated with the landed side are provided with the same voltage to avoid shortage during contact. Therefore, there is no potential difference between the mirror and the springtip associated with the landed side. The mirror and an electrode associated with the landed side may be separated by an air gap and provided with different voltages, which in turn causes a potential difference between the mirror and the electrode. The potential difference between the mirror and the electrode creates an electric field, which in turn creates an electrostatic force. The electrostatic force corresponds to the compression force that compresses the springtip associated with the landed side against the mirror. The compression force corresponds to the separating force that may break the contact between the mirror and the springtip associated with the landed side.

Challenges arise to overcome surface adhesion forces as micromirrors decrease size. Decreasing the size of micromirrors causes the electrostatic forces to decrease due to scaling relationships. For example, the electrostatic force scales down proportional to area of the micromirror. However, the surface adhesion forces do not scale down as the size of micromirrors decreases. As a result, the separating force may not overcome the surface adhesion forces in smaller micromirrors. In the example above, the electrostatic force between the electrode and the mirror is proportional to the dielectric constant multiplied by the square of the potential difference between the electrode and the mirror. Further, the electrostatic force between the electrode and the mirror is inversely proportional to the square of the distance between the electrode and the mirror. A solution to improve the electrostatic force to overcome the surface adhesion forces can be to increase the potential difference by increasing the voltage provided to the mirror. However, the potential difference may exceed a breakdown voltage, which could cause a shorting between the electrode and the mirror. The shorting is a field emission across the air gap between the electrode and the mirror.

Example approaches disclosed herein implement hot-landing micromirror designs to prevent stiction by improving electrostatic forces and mitigating dielectric charge trapping. The hot-landing micromirror designs utilize a hot-landing, which is a direct contact between an electrode and an element in the micromirror. The element may be a structure in the micromirror. In cases where a mirror is tilted towards the landed side, the hot-landing occurs between the electrode and the element associated with the landed side. The electrode and the element are both conductive materials (e.g., aluminum). Either the electrode or the element has a dielectric coating to prevent shorting between the electrode and the element. The dielectric coating is a non-conductive material (e.g., silicon dioxide and silicon nitride) deposited over either the electrode or the element.

A strong electric field is created between the electrode and the element, which in turn creates a strong electrostatic force. As a result, the strong electrostatic force corresponds to a strong compression force, which in turn creates a strong separating force between the electrode and the element. As described above, an electrostatic force between the electrode and the element is proportional to the dielectric constant multiplied by the square of the potential difference between the electrode and the mirror. Further, the electrostatic force between the electrode and the mirror is inversely proportional to the square of the distance between the electrode and the element. The strong electrostatic force is created without changing the potential difference between the electrode and the element. The electrostatic force is strong because the distance between the electrode and the element is reduced by providing direct contact between the electrode and the element. Further, the electrostatic force is strong because the dielectric coating has a large dielectric constant. The electrostatic force is strong compared to other micromirror designs such as, for example, micromirrors having a larger distance between the electrode and the element and a lower dielectric constant.

In one example, the element is a springtip and the electrode includes the dielectric coating. In cases where the electrode and the springtip are both associated with the landed side, the hot-landing is a direct contact between the electrode and the springtip. As a result, the springtip is in contact with the dielectric coating of the electrode. In another example, the element is a mirror with the dielectric coating and the electrode is combined with a springtip. In cases where the electrode combined with the springtip is associated with the landed side, the hot-landing is a direct contact between the mirror and the springtip combined with the electrode. As a result, the springtip is in contact with the dielectric coating of the mirror.

Dielectric charge trapping occurs when an electric field is applied across a dielectric. Due to the dielectric coating implemented on either the element or the electrode of a hot-landing micromirror design, dielectric charge trapping occurs that does not easily dissipate. Such dielectric charge trapping reduces the electrostatic force, which in turn reduces the separating force. As a result, stiction may occur because the separating force does not overcome surface adhesion forces.

In one example, the polarity of the voltage provided to the mirror in a landing position is reversed for a period of time to mitigate dielectric charge trapping. For example, the charge accumulated in the dielectric is being pulled out during the period of time. In another example, the electrodes on each side of a micromirror are separated into two electrodes: an inner electrode and an outer latch electrode. An electric field is created between the inner electrode and the element to provide energy for springtip compression and launch. However, an electric field is created between the outer latch electrode and the element during the landing position.

FIG. 1 is a top view illustration of an example display system 100. The display system 100 may be any display system such as, for example, a projector, a video wall, a multi-view monitor, a stereoscopic display, a monitor with multiple display surfaces, a multi-focal plane display, a near eye display (e.g., 3D glasses), a headset, a 3D printer, a vehicle headlight, etc. The display system 100 includes a digital micromirror device (DMD) 110 and a driver 120. The DMD 110 is a spatial light modulator (SLM) that is also an optical MEMS device. The driver 120 includes a motor driver and/or a power management integrated circuit (PMIC) to supply power for the DMD 110. In some examples, additional drivers are utilized to supply power for the DMD 110. The DMD 110 and the driver 120 may be implemented on one or more systems-on-a-chip.

The DMD 110 includes an array of micromirrors 105 of any size (e.g., an 800×600 array, a 1,920×1,080 array). In some examples, a micromirror 130 is referred to as a pixel and/or a picture element. The micromirror 130 is reflective, and is utilized to modulate light. For example, the micromirror 130 transmits light to projection optics (not pictured). The projection optics (not pictured) illuminate a display associated with the display system 100 such as, for example, an image plane (e.g., a display screen). The micromirror 130 includes a mirror that tilts relative to the DMD 110 surface. The micromirror 105 may be divided into two sides: an off side and an on side. In cases where the mirror is tilted towards the off side, the mirror reflects light from the micromirror 130 away from the projection optics (not pictured). Alternatively, the mirror is tilted towards the on side and reflects light from the micromirror 130 towards the projection optics (not pictured). The structure of the micromirror 130 includes layers described in FIG. 2. Each micromirror in the array of micromirrors 105 is individually addressed to control the tilt position.

The driver 120 includes power sources to operate the DMD 110. For example, the driver 120 generates voltage signals for the array of micromirrors 105. The array of micromirrors 105 may be divided into blocks (also known as groups). For example, as shown in FIG. 1, the array of micromirrors 105 is divided into a first block 140 and a second block 150. The blocks 140, 150 are coupled to the driver 120 via one or more electrical connection lines (hereinafter "lines"). In one example, the array of micromirrors 105 is an 800×600 micromirror array, and the blocks 140, 150 are 400×600 micromirror arrays. In some examples, the driver 120 generates voltage signals at a block level. Generating voltage signals at the block level refers to the driver 120 generating voltage signals for each micromirror block. For example, as shown in FIG. 1, a first line 160 provides first voltage signals to each micromirror in the first block 140, and a second line 170 provides second voltage signals to each micromirror in the second block 150. The first voltage signals control each micromirror in the first block 140, and the second voltage signals control each micromirror in the second block 150. Voltage signals (e.g., the first voltage signals and second voltage signals) provide voltage to the array of micromirrors 105 to control tilts of mirrors.

Figure 2:
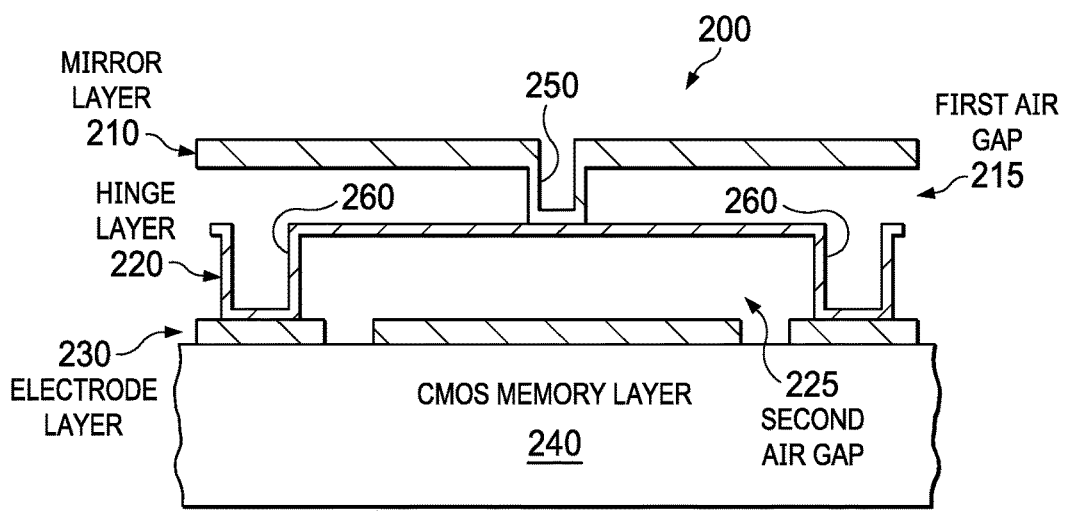
FIG. 2 is a cross-sectional view illustration of layers of an example micromirror.

FIG. 2 is a cross-sectional view illustration of layers of an example micromirror 200. The micromirror 200 describes the structure corresponding to layers of the micromirror 130 of FIG. 1. The micromirror 200 includes a mirror layer 210, a first air gap 215, a hinge layer 220, a second air gap 225, an electrode layer 230, and a complementary metal-oxide-semiconductor (CMOS) memory layer 240. The mirror layer 210, the hinge layer 220, and the electrode layer 230 may be metal layers.

The mirror layer 210 may include a reflective mirror and one or more mirror vias, such as a mirror via 250 shown in FIG. 2. In some examples, the mirror via 250 is referred to as a mirror support post. The hinge layer 220 may include a hinge and springtips (not pictured). Further, the hinge layer 220 includes one or more hinge vias, such as hinge vias 260 shown in FIG. 2. The electrode layer 230 may include an address bus, electrodes, and CMOS vias (not pictured). The CMOS memory layer 240 includes a memory cell (not pictured). The mirror layer 210 is coupled to the hinge layer 220 by mirror via(s) (e.g., a mirror via 250); the hinge layer 220 is coupled to the electrode layer 230 by hinge vias (e.g., hinge vias 260); the electrode layer 230 is coupled to the CMOS memory layer 240 by CMOS vias (not pictured). The mirror via(s) are coupled to the hinge and the mirror such that the mirror may tilt. The hinge may be any hinge such as, for example, a torsion hinge, a cantilever hinge, etc. In some examples, the mirror has a dielectric coating as described in FIGS. 13-15. In other examples, the electrodes have dielectric coatings as described in FIGS. 3-12. In some examples, the springtips are coupled to the hinge as described in FIGS. 3-12. In other examples, the springtips are combined with electrodes that are raised as described in FIGS. 13-15. Hinge vias are coupled to the hinge and the address bus. The address bus is coupled to the CMOS memory layer 240. The CMOS vias are coupled to the memory cell and electrodes. The memory cell stores a mirror position. The mirror position may be either an on position (e.g., the mirror is to tilt towards the on side described in FIG. 1) or an off position (e.g., the mirror is to tilt towards the off side described in FIG. 1). The mirror position may be loaded by a controller that provides image data to the memory cell.

As described above, the address bus is located in the electrode layer 230, the hinge is located in the hinge layer 220, the address bus is coupled to the hinge by hinge vias (e.g., hinge vias 260), the mirror is located in the mirror layer 210, and the electrode layer 230 is coupled to the mirror layer 210 by the mirror via(s) (e.g., a mirror via 250). The address bus, the hinge vias, the hinge, the mirror via(s), and the mirror may include terminals to control voltage provided to the mirror. For example, a mirror bias and reset (MBRST) signal is provided to a terminal associated with the address bus from a voltage source (e.g., the driver 120 of FIG. 1) via one or more lines (e.g., the lines 160, 170 of FIG. 1). The MBRST signal is provided from the terminal associated with the address bus to terminals associated with the hinge vias. The MBRST signal is provided from the terminals associated with the hinge vias to terminals associated with the hinge. The MBRST signal is provided from the terminals associated with the hinge to terminal(s) associated with the mirror via(s). The MBRST signal is provided from the terminal(s) associated with the mirror via(s) to terminal(s) associated with the mirror. As a result, the MBRST signal controls the voltage provided to the mirror included in the mirror layer 210. Further, in some examples, springtips are coupled to the hinge as described in FIGS. 3-12. The springtips include terminals. The MBRST signal is provided from the terminals associated with the hinge to terminals associated with the springtips. As a result, the MBRST signal controls the voltage provided to the springtips. Details of the MBRST signal are described in FIGS. 16, 17, and 20.

As described above, the memory cell is located in the CMOS memory layer 240, electrodes are located in the electrode layer 230, and the memory cell is coupled to the electrodes by CMOS vias. The memory cell, the CMOS vias, and the electrodes include terminals to control voltage provided to the electrodes. For example, a CMOS signal is provided to a terminal associated with the memory cell from a voltage source (e.g., the driver 120 of FIG. 1) via one or more lines (e.g., the lines 160, 170 of FIG. 1). The CMOS signal is provided from the terminal associated with the memory cell to terminals associated with the CMOS vias. The CMOS signal is provided from the terminals associated with the CMOS vias to terminals associated with the electrodes. As a result, the CMOS signal controls the voltages provided to the electrodes included in the electrode layer 230. Further, in some examples, the springtips are combined with electrodes that are raised as described in FIGS. 13-15. The springtips include terminals. The CMOS signal is provided from the terminals associated with the electrodes to terminals associated with the springtips. As a result, the CMOS signal controls the voltage provided to the springtips. Details of the CMOS signal are described in FIGS. 16 and 20. Alternatively, in some examples, a set of the electrodes from the electrode layer 230 may be provided with a latch signal. The set of the electrodes includes terminals to control voltage provided to the set of the electrodes. For example, a latch signal is provided to terminals associated with the set of the electrodes from a voltage source (e.g., the driver 120 of FIG. 1) via one or more lines (e.g., the lines 160, 170 of FIG. 1). Details of the latch signal are described in FIG. 20.

Figure 3:
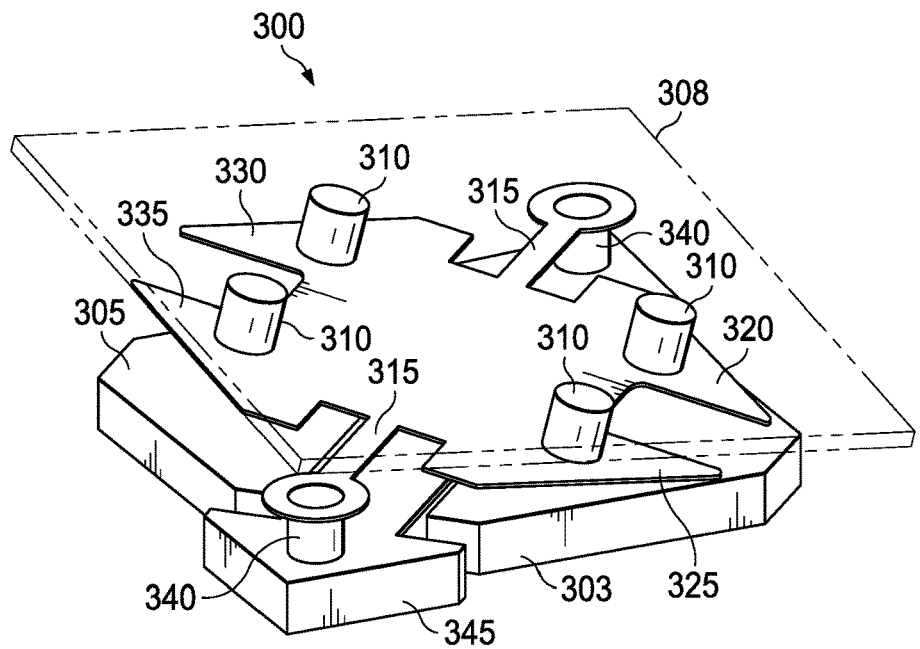
FIG. 3 is a first illustration of an example first hot-landing micromirror including electrodes with a dielectric coating.

FIG. 3 is a first illustration of an example first hot-landing micromirror 300 including electrodes 303, 305 with dielectric coatings. The first illustration is an isometric view. The first hot-landing micromirror 300 is an example of the micromirror 130 of FIG. 1. The first hot-landing micromirror 300 includes a mirror 308, mirror vias 310, a hinge 315, springtips 320, 325, 330, 335, hinge vias 340, electrodes 303, 305, and an address bus 345. The mirror vias 310 include four mirror vias; the springtips 320, 325, 330, 335 include four springtips; the hinge vias 340 include two hinge vias; and the electrodes 303, 305 include two electrodes. The springtips 320, 325, 330, and 335 combined with the hinge 315 may be referred to as a hinge layer. The hinge layer comprised of the springtips 320-335 and the hinge 315, enable the compression of the springtips 320-335 to aid in overcoming surface adhesion. The springtips 320, 325 include two springtips associated a first side of the mirror 308, the springtips 330, 335 include two springtips associated a second side of the mirror 308. Only two of the four mirror vias 310 are shown in FIG. 3 due to the isometric view. Each of the electrodes 303, 305 are covered in a dielectric coating to prevent shorting between the mirror 308 and the electrodes 303, 305 during the landing position. The dielectric coating 1210 may consist of a relatively thin layer of a dielectric material (e.g., a material with a dielectric constant greater than 1), such that the generated electrostatic force is enough to overcome the surface adhesion forces. As shown in FIG. 3, the first hot-landing micromirror 300 is in a landing position where the springtips 320, 325 are compressed against the electrode 303. In one example, the electrode 303 is the on side, and the electrode 305 is the off side. As a result, the landing position shown in FIG. 3 corresponds to the mirror 308 being in an on position. Alternatively, in cases where the springtips 330, 335 are compressed against the electrode 305, the mirror 308 is in an off position.

Figure 4:
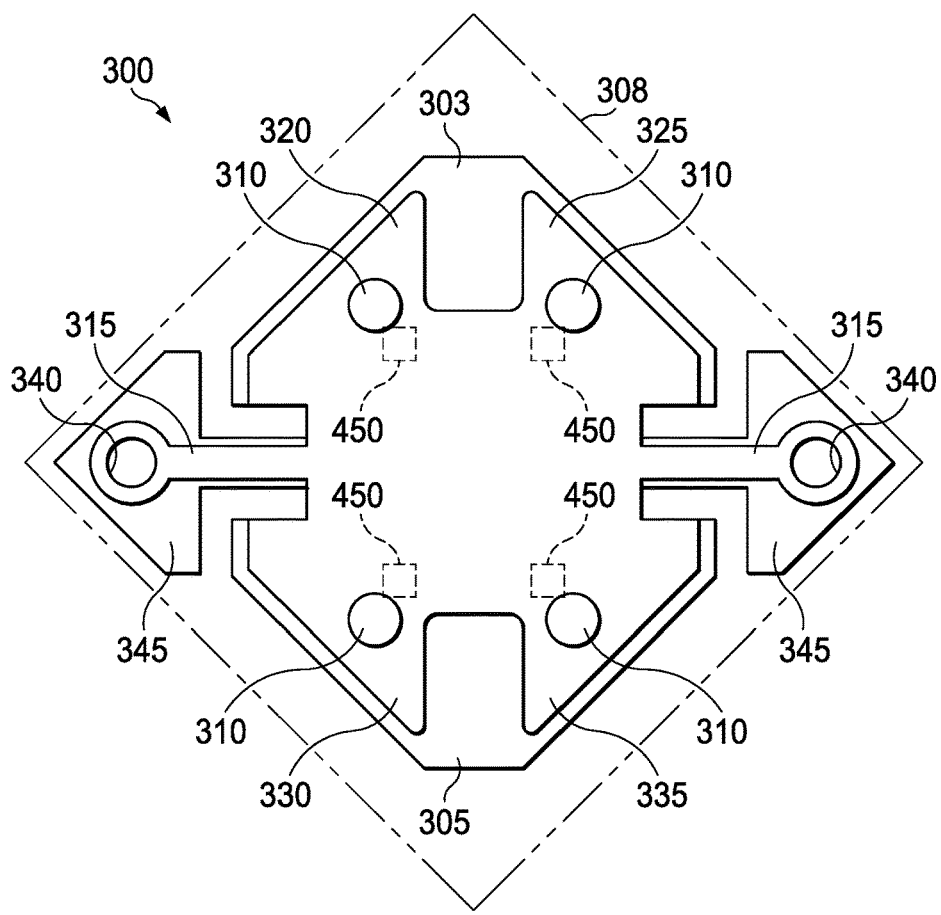
FIG. 4 is a second illustration of an example first hot-landing micromirror.

FIG. 4 is a second illustration of the first hot-landing micromirror 300. The second illustration is a top view of the first hot-landing micromirror 300. The second illustration is a different view of the same first hot-landing micromirror 300 from FIG. 3. The first hot-landing micromirror 300 includes electrodes 303, 305, a mirror 308, mirror vias 310, a hinge 315, springtips 320, 325, 330, 335, hinge vias 340, an address bus 345, and CMOS vias 450.

Figure 5:
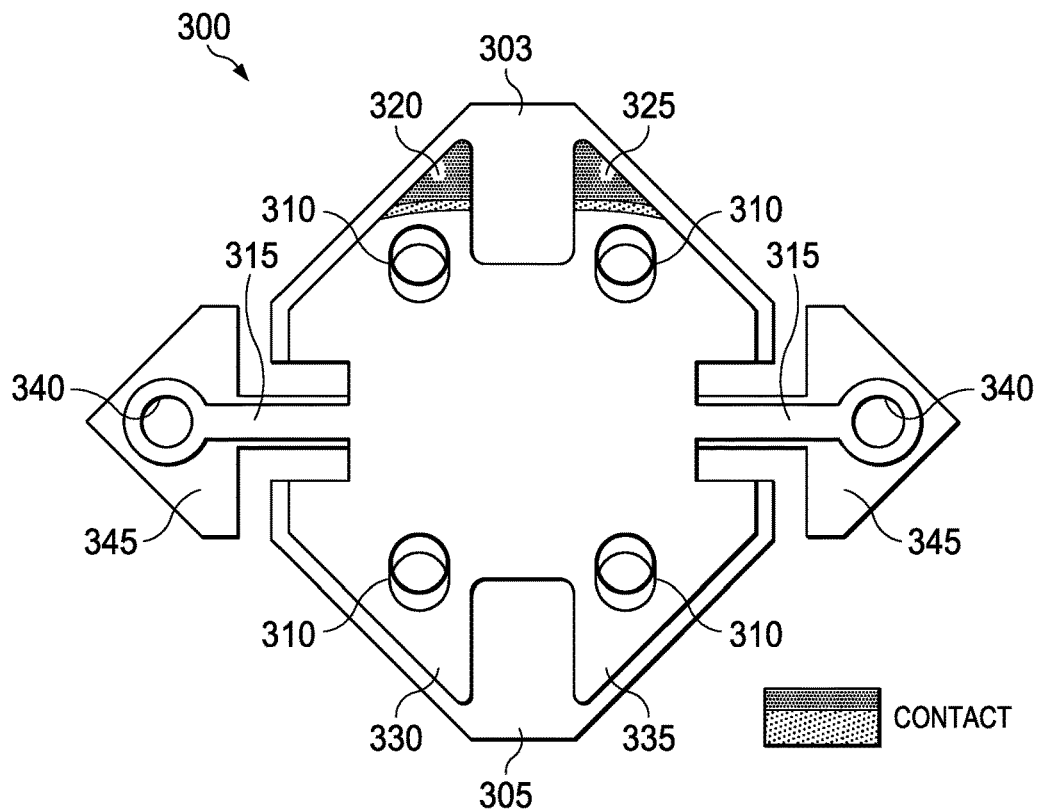
FIG. 5 is a third illustration of an example first hot-landing micromirror.

FIG. 5 is a third illustration of an example first hot-landing micromirror 300. The third illustration is a top view of the first hot-landing micromirror 300. The third illustration is a different view of the same first hot-landing micromirror 300 from FIG. 3 and FIG. 4. The first hot-landing micromirror 300 includes electrodes 303, 305, mirror vias 310, a hinge 315, springtips 320, 325, 330, 335, hinge vias 340, and an address bus 345. In one example, the electrode 303 is the on side, and the electrode 305 is the off side. As a result, the landing position shown in FIG. 5 corresponds to a mirror being in an on position because the springtips 320, 325 are compressed against the electrode 303 associated with the on side. Alternatively, in cases where the springtips 330, 335 are compressed against the electrode 305 associated with the off side, the mirror is in an off position.

Figure 6:
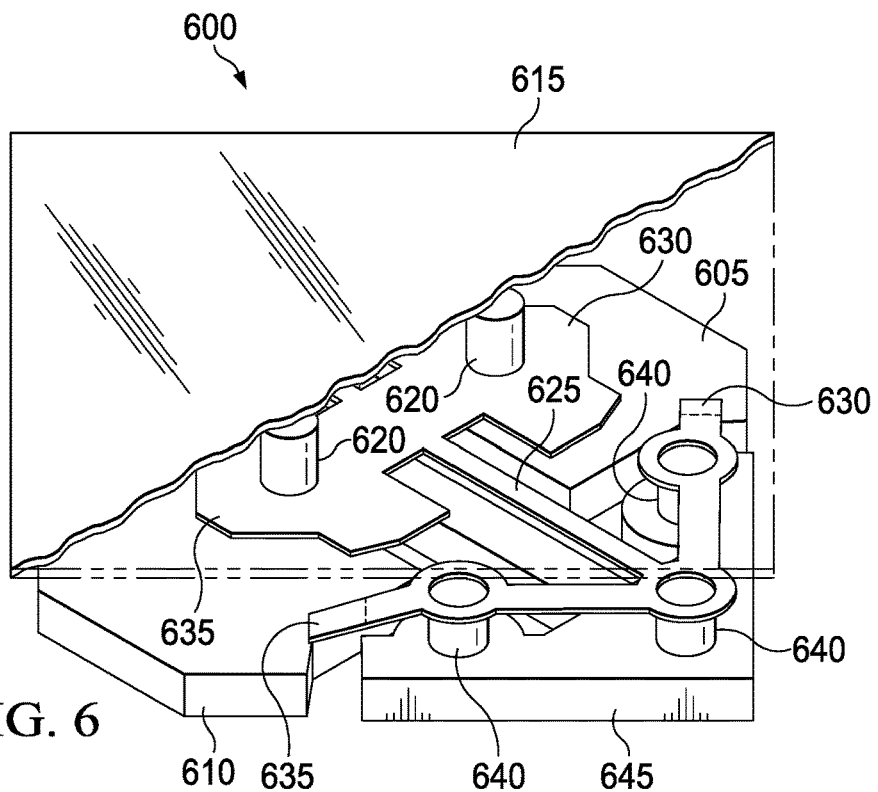
FIG. 6 is a first illustration of an example second hot-landing micromirror including electrodes with a dielectric coating.

FIG. 6 is a first illustration of an example second hot-landing micromirror 600 including electrodes 605, 610 with dielectric coatings. The first illustration is an isometric view of the second hot-landing micromirror 600. The second hot-landing micromirror 600 includes a mirror 615, mirror vias 620, a hinge 625, springtips 630, 635, hinge vias 640, electrodes 605, 610, and an address bus 645. The mirror vias 620 include two mirror vias; the springtips 630, 635 include six springtips; the hinge vias 640 include six hinge vias; and the electrodes 605, 610 include two electrodes. The springtips 630 and 635 combined with the hinge 625 may be referred to as a hinge layer. The springtips 630 include three springtips associated a first side of the mirror 615, the springtips 635 include three springtips associated a second side of the mirror 615. One side of the mirror 615 is shown transparent in FIG. 6 to show the underlying structure of the second hot-landing micromirror 600. In one example, the electrode 605 is the on side, and the electrode 610 is the off side. In cases where the springtips 630 are compressed against the electrode 605 associated with the on side, the landing position corresponds to the mirror 615 being in an on position. Alternatively, in cases where the springtips 635 are compressed against the electrode 610 associated with the off side, the landing position corresponds to the mirror 615 being in an off position.

Figure 7:
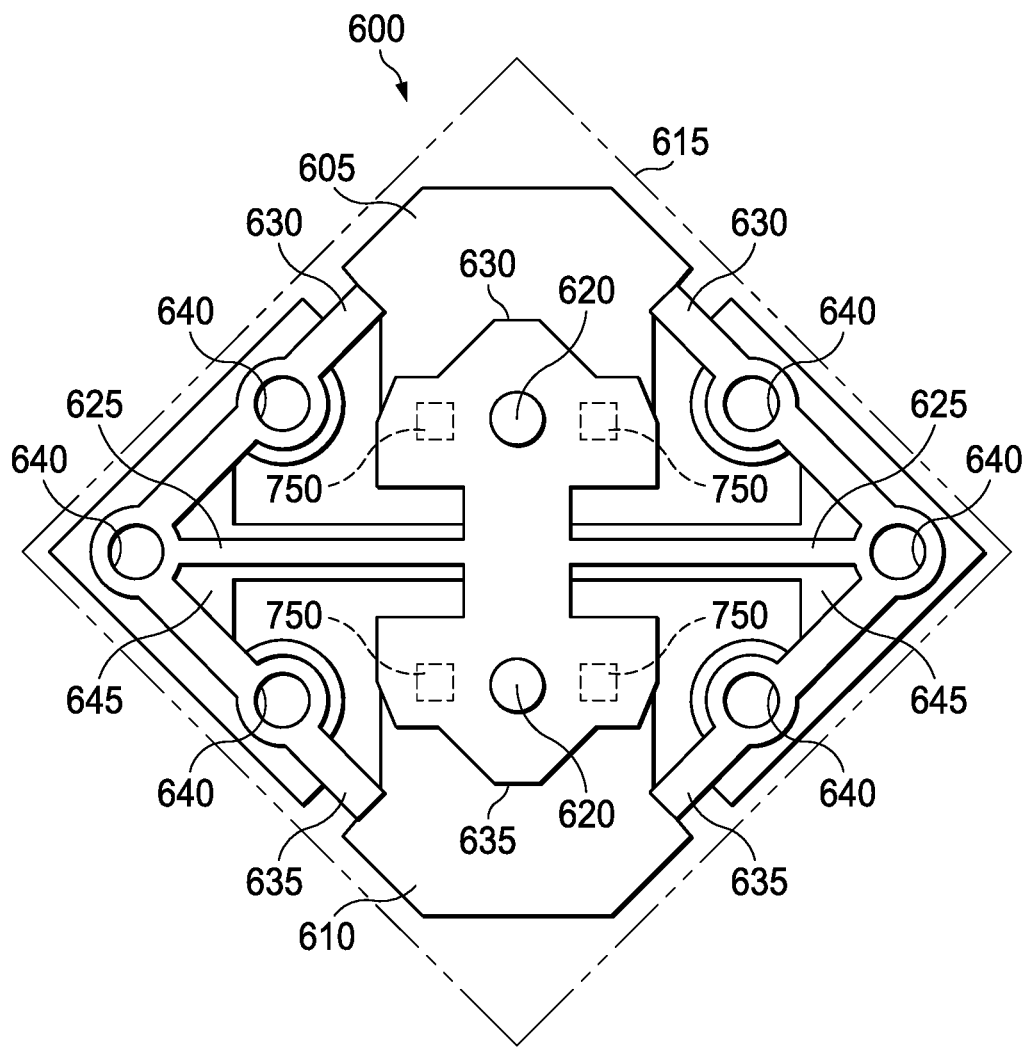
FIG. 7 is a second illustration of an example second hot-landing micromirror.

FIG. 7 is a second illustration of an example second hot-landing micromirror 600. The second illustration is a top view of the second hot-landing micromirror 600. The second illustration is a different view of the second hot-landing micromirror 600 of FIG. 6. The second hot-landing micromirror 600 includes electrodes 605, 610, a mirror 615, mirror vias 620, a hinge 625, springtips 630, 635 hinge vias 640, an address bus 645, and CMOS vias 750.

Figure 8:
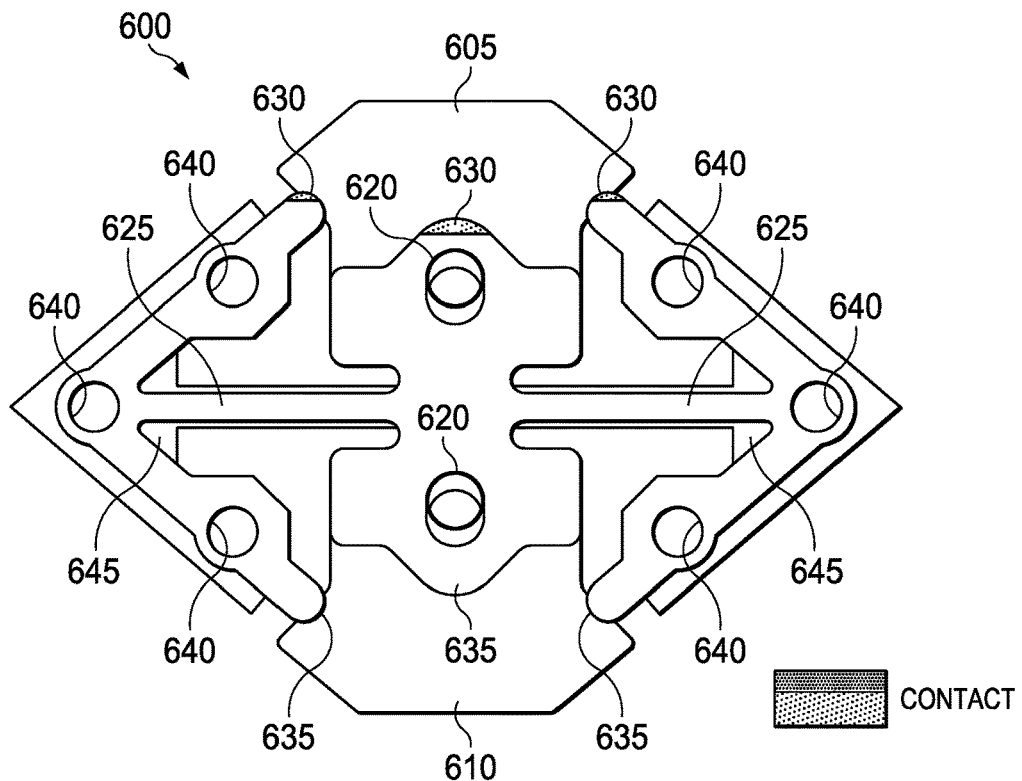
FIG. 8 is a third illustration of an example second hot-landing micromirror.

FIG. 8 is a third illustration of an example second hot-landing micromirror 600. The third illustration is a top view of the second hot-landing micromirror 600. The third illustration is a different view of the second hot-landing micromirror 600 of FIG. 6 and FIG. 7. The second hot-landing micromirror 600 includes electrodes 605, 610, mirror vias 620, a hinge 625, springtips 630, 635, hinge vias 640, and an address bus 645. In one example, the electrode 605 is the on side, and the electrode 610 is the off side. As a result, the landing position shown in FIG. 8 corresponds to a mirror associated with the second hot-landing micromirror 600 being in an on position because the springtips 630 are compressed against the electrode 605 associated with the on side. Alternatively, in cases where the springtips 635 are compressed against the electrode 610 associated with the off side, the mirror associated with the second hot-landing micromirror 600 is in an off position.

Figure 9:
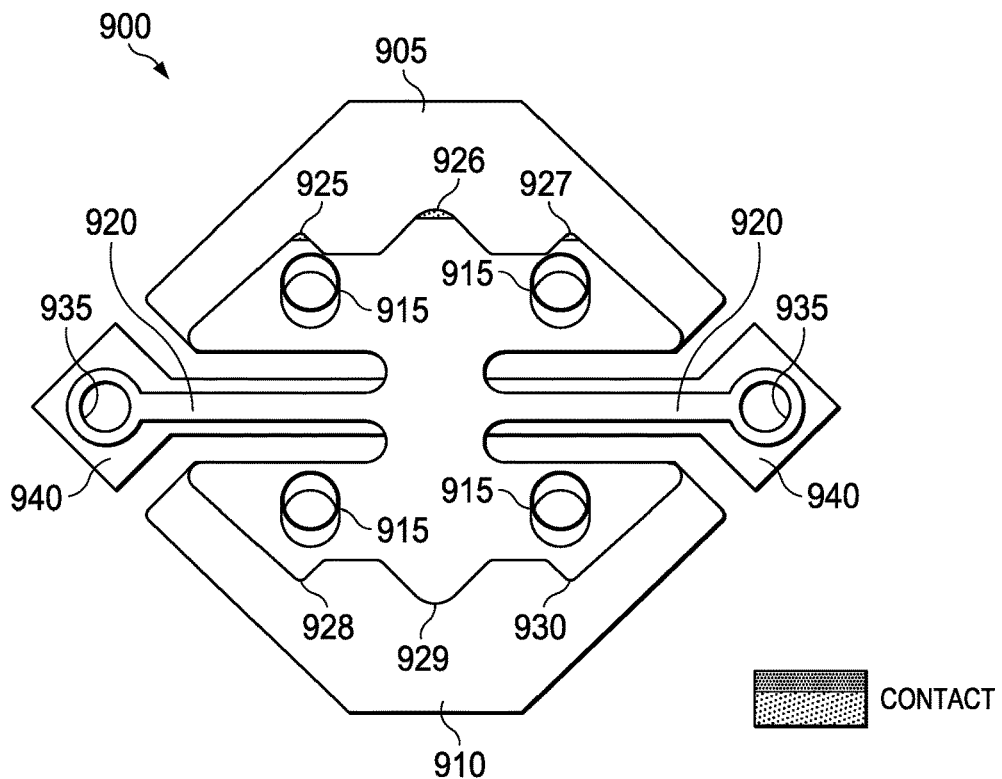
FIG. 9 is an illustration of an example third hot-landing micromirror including electrodes with a dielectric coating.

FIG. 9 is an illustration of an example third hot-landing micromirror 900 including electrodes 905, 910 with dielectric coatings. The illustration is a top view of the third hot-landing micromirror 900. The third hot-landing micromirror 900 includes mirror vias 915, a hinge 920, springtips 925-930, hinge vias 935, electrodes 905, 910, an address bus 940. The mirror vias 915 include four mirror vias; the springtips 925-930 include six springtips; the hinge vias 935 include two hinge vias; and the electrodes 905, 910 include two electrodes. The springtips 925-927 include three springtips associated with a first side of the third hot-landing micromirror 900, and the springtips 928-930 include three springtips associated with a second side of third hot-landing micromirror 900. In one example, the electrode 905 is the on side, and the electrode 910 is the off side. As a result, the landing position shown in FIG. 9 corresponds to a mirror associated with the third hot-landing micromirror 900 being in an on position because the springtips 925-927 are compressed against the electrode 905 associated with the on side. Alternatively, in cases where the springtips 928-930 are compressed against the electrode 910 associated with the off side, the mirror associated with the third hot-landing micromirror 900 is in an off position.

Figure 10:
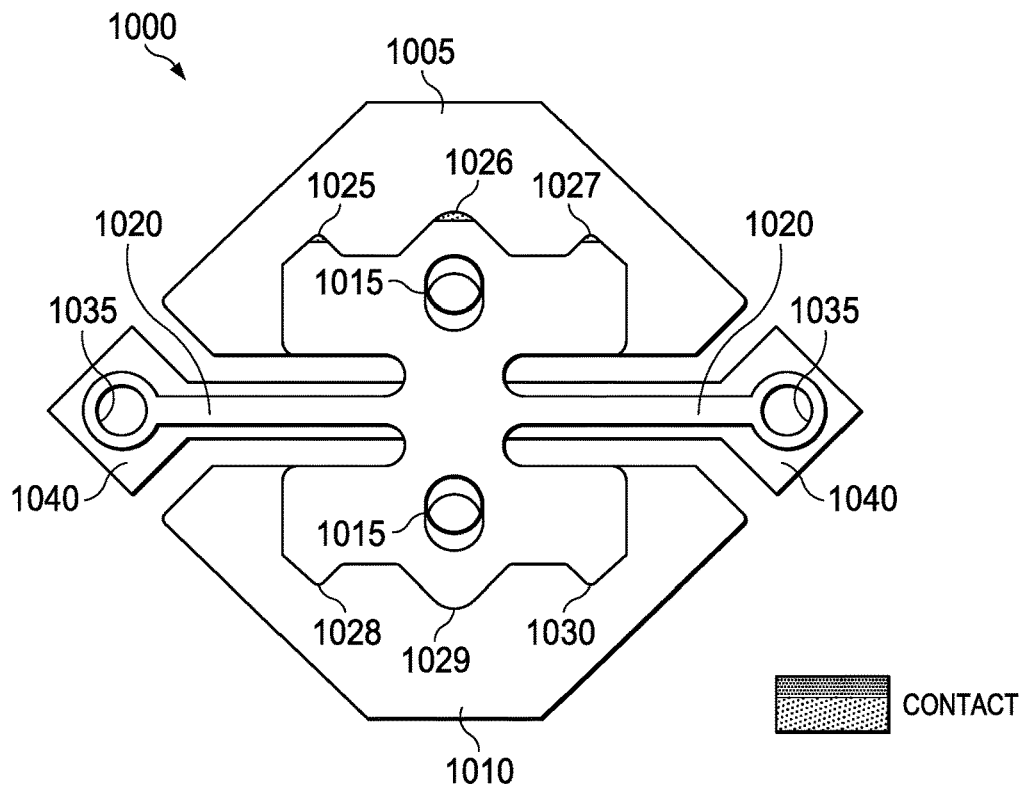
FIG. 10 is an illustration of an example fourth hot-landing micromirror including electrodes with a dielectric coating.

FIG. 10 is an illustration of an example fourth hot-landing micromirror 1000 including electrodes 1005, 1010 with dielectric coatings. The illustration is a top view of the fourth hot-landing micromirror 1000. The fourth hot-landing micromirror 1000 includes mirror vias 1015, a hinge 1020, springtips 1025-1030, hinge vias 1035, electrodes 1005, 1010, an address bus 1040. The mirror vias 1015 include two mirror vias; the springtips 1025-1030 include six springtips; the hinge vias 1035 include two hinge vias; and the electrodes 1005, 1010 include two electrodes. The springtips 1025-1027 include three springtips associated with a first side of the fourth hot-landing micromirror 1000, and the springtips 1028-1030 include three springtips associated with a second side of the fourth hot-landing micromirror 1000. In one example, the electrode 1005 is the on side, and the electrode 1010 is the off side. As a result, the landing position shown in FIG. 10 corresponds to a mirror being in an on position because the springtips 1025-1028 are compressed against the electrode 1005 associated with the on side. Alternatively, in cases where the springtips 1028-1030 are compressed against the electrode 1010 associated with the off side, the mirror is in an off position.

Figure 11:
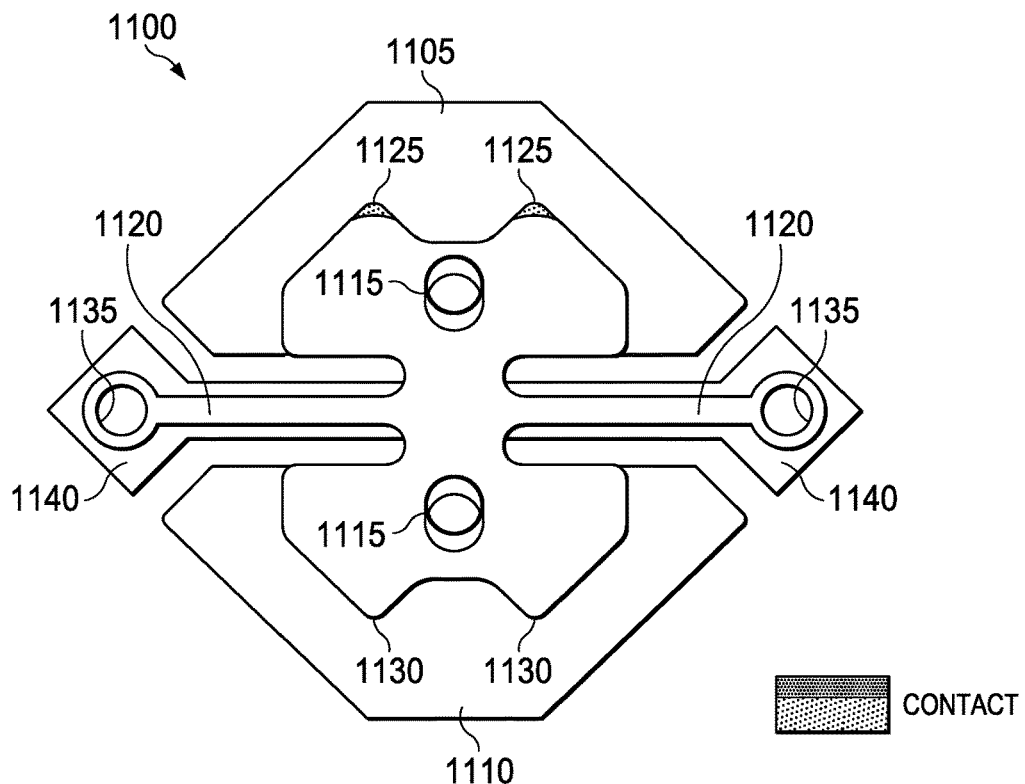
FIG. 11 is an illustration of an example fifth hot-landing micromirror including electrodes with a dielectric coating.

FIG. 11 is an illustration of an example fifth hot-landing micromirror 1100 including electrodes 1105, 1110 with dielectric coatings. The illustration is a top view of the fifth hot-landing micromirror 1100. The fifth hot-landing micromirror 1100 includes mirror vias 1115, a hinge 1120, springtips 1125, 1130, hinge vias 1135, electrodes 1105, 1110, an address bus 1140. The mirror vias 1115 include two mirror vias; the springtips 1125, 1130 include four springtips; the hinge vias 1135 include two hinge vias; and the electrodes 1105, 1110 include two electrodes. The springtips 1125 include two springtips associated with a first side of the fifth hot-landing micromirror 1100, and the springtips 1130 include two springtips associated with a second side of the fifth hot-landing micromirror 1100. In one example, the electrode 1105 is the on side, and the electrode 1110 is the off side. As a result, the landing position shown in FIG. 11 corresponds to a mirror being in an on position because the springtips 1125 are compressed against the electrode 1105 associated with the on side. Alternatively, in cases where the springtips 1130 are compressed against the electrode 1110 associated with the off side, the mirror is in an off position.

Figure 12:
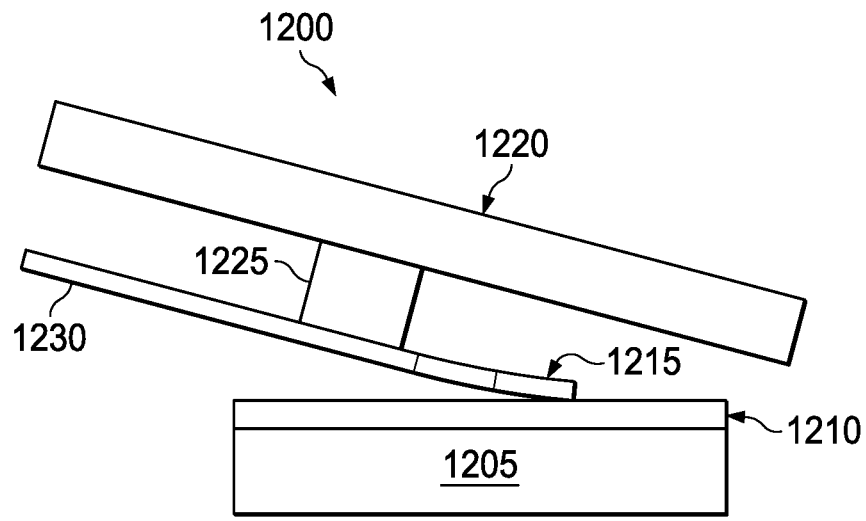
FIG. 12 is an illustration of an example hot-landing micromirror including an electrode with a dielectric coating.

FIG. 12 is an illustration of an example hot-landing micromirror 1200 including an electrode 1205 with a dielectric coating 1210. The illustration is a side view of a portion of the hot-landing micromirror 1200. The dielectric coating 1210 may consist of a relatively thin layer of a dielectric material (e.g., a material with a dielectric constant greater than 1), such that the generated electrostatic force is enough to overcome the surface adhesion forces. The portion of the hot-landing micromirror 1200 shows a springtip 1215 compressed against the electrode 1205 with a dielectric coating 1210. The hot-landing micromirror 1200 is an example of the first hot-landing micromirror 300, 400, 500 of FIGS. 3-5, the second hot-landing micromirror 600 of FIGS. 6-8, the third hot-landing micromirror 900 of FIG. 9, the fourth hot-landing micromirror 1000 of FIG. 10, and/or the fifth hot-landing micromirror 1100 of FIG. 11. The hot-landing micromirror 1200 includes a mirror 1220, a mirror via 1225, a hinge layer 1230, the springtip 1215, and the electrode 1205. In one example, the electrode 1205 is the on side. As a result, the landing position shown in FIG. 12 corresponds to the mirror 1220 being in an on position because the springtip 1215 is compressed against the electrode 1205 associated with the on side. Alternatively, the electrode 1205 is the off side. As a result, the landing position shown in FIG. 12 corresponds to the mirror 1220 being in an off position because the springtip 1215 is compressed against the electrode 1205 associated with the off side. The hinge layer 1230 comprises of springtip 1215 and a hinge (not pictured).

Figure 13:
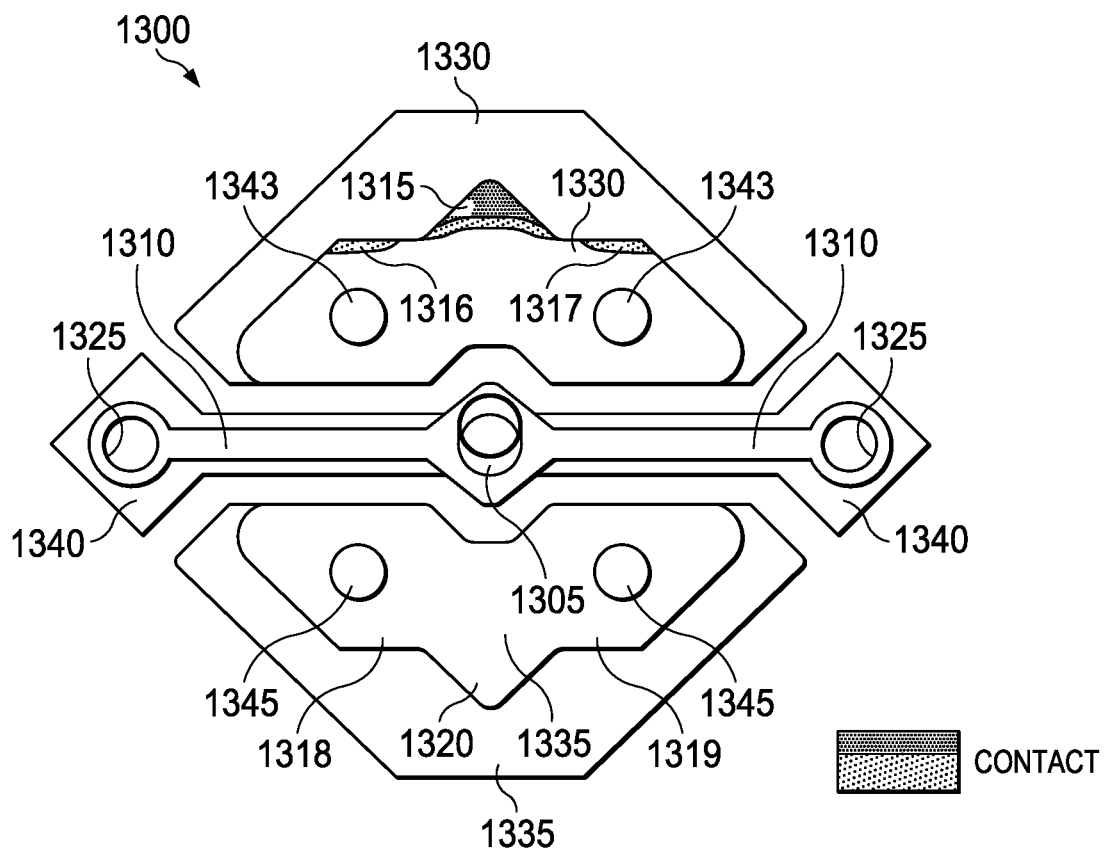
FIG. 13 is a first illustration of an example sixth hot-landing micromirror including a mirror with a dielectric coating.

FIG. 13 is a first illustration of an example sixth hot-landing micromirror 1300 including a mirror with a dielectric coating. The illustration is a top view of the sixth hot-landing micromirror 1300. The sixth hot-landing micromirror 1300 includes a mirror via 1305, a hinge 1310, springtips 1315-1320, hinge vias 1325, raised electrodes 1330, 1335, and an address bus 1340. The raised electrodes 1330, 1335 are raised by electrode posts 1343, 1345. The electrode posts 1343 may include a set of electrode posts. The electrode posts 1345 may include two electrode posts. In one example, the raised electrode 1330 is the on side, and the raised electrode 1335 is the off side. As a result, the landing position shown in FIG. 13 corresponds to a mirror being in an on position because the springtips 1315-1317 are compressed against the mirror, such that springtip 1315 may be compressed more than springtips 1316-1317 based on a greater contact area with the mirror. Alternatively, in cases where the springtips 1318-1320 are compressed against the mirror, the mirror is in an off position.

Figure 14:
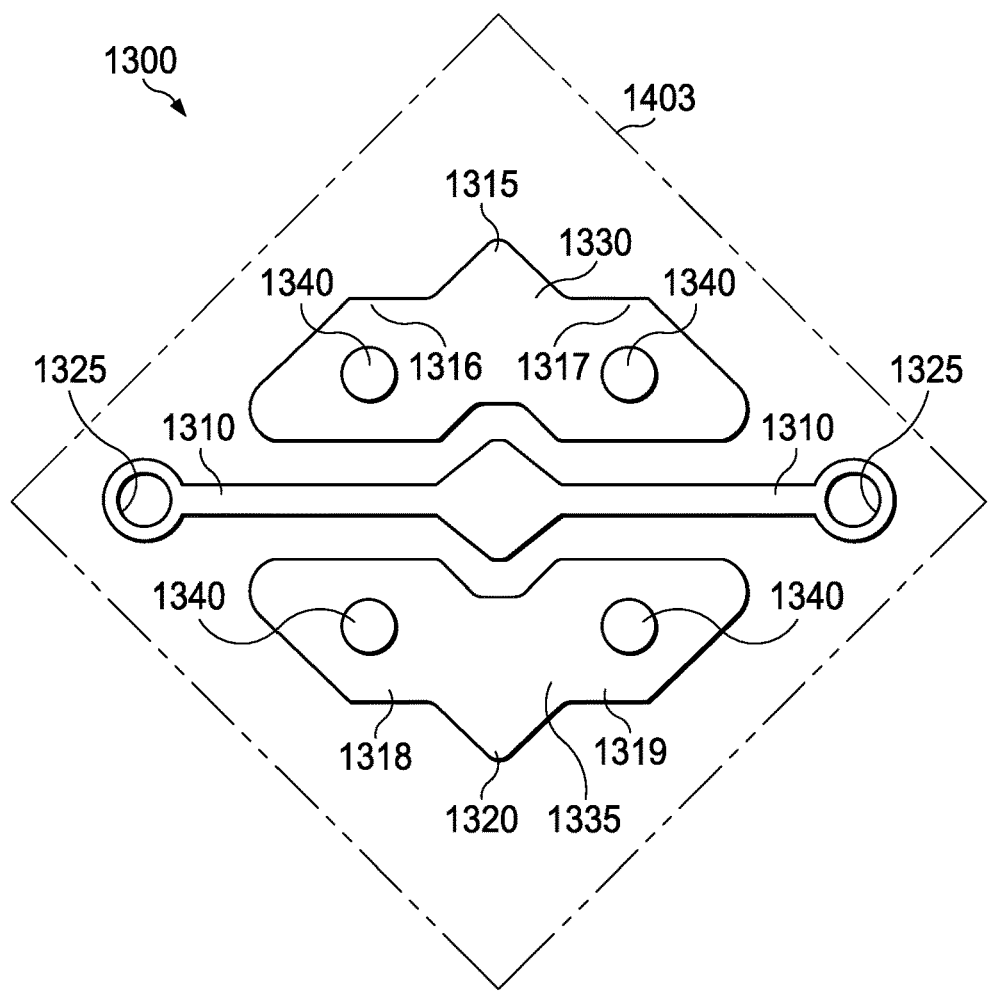
FIG. 14 is a second illustration of an example sixth hot-landing micromirror including a mirror with a dielectric coating.

FIG. 14 is a second illustration of an example sixth hot-landing micromirror 1300 including a mirror 1403 with a dielectric coating. The illustration is a top view of the sixth hot-landing micromirror 1300. The sixth hot-landing micromirror 1300 includes a mirror 1403, a hinge 1310, springtips 1315-1320, hinge vias 1325, and raised electrodes 1330, 1335. The raised electrodes 1330, 1335 includes electrode posts 1340. The springtips 1315-1320 are combined with the raised electrodes 1330, 1335.

Figure 15:
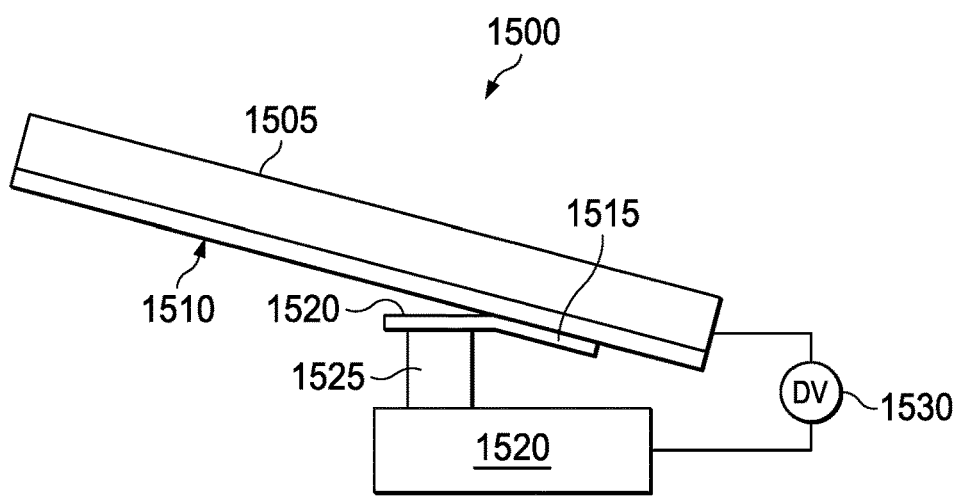
FIG. 15 is an illustration of an example hot-landing micromirror including a mirror with a dielectric coating.

FIG. 15 is an illustration of an example hot-landing micromirror 1500 including a mirror 1505 with a dielectric coating 1510. The illustration is a side view of a portion of the hot-landing micromirror 1500. The portion of the hot-landing micromirror 1500 shows a springtip 1515 compressed against the mirror 1505 with a dielectric coating 1510. The hot-landing micromirror 1500 is an example of the sixth hot-landing micromirror 1300 of FIG. 13 and/or the sixth hot-landing micromirror 1400 of FIG. 14. The hot-landing micromirror 1500 includes the mirror 1505, the springtip 1515, and a raised electrode 1520. The raised electrode 1520 includes an electrode post 1525. The raised electrode 1520 is combined with the springtip 1515. In one example, the raised electrode 1520 is the on side. As a result, the landing position shown in FIG. 15 corresponds to the mirror 1505 being in an on position because the springtip 1515 combined with the raised electrode 1520 associated with the on side is compressed against the mirror 1505. Alternatively, the raised electrode 1520 is the off side. As a result, the landing position shown in FIG. 15 corresponds to the mirror 1505 being in an off position because the springtip 1515 combined with the raised electrode 1520 associated with the off side is compressed against the mirror 1505.

Figure 16:
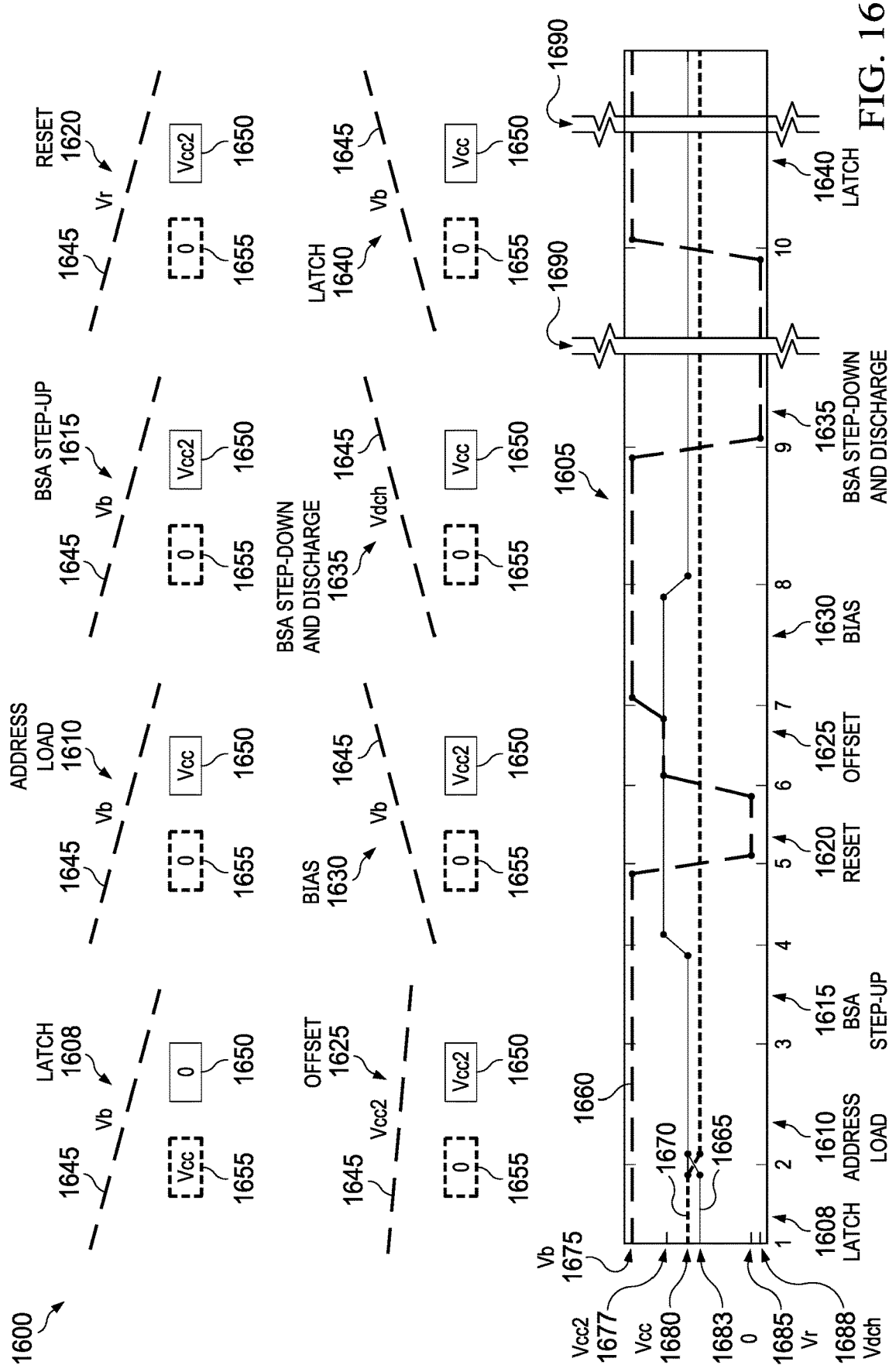
FIG. 16 is an illustration of mirror states and waveforms associated with the mirror states to mitigate dielectric charging utilizing reverse-polarity.

FIG. 16 is an illustration of mirror states 1600 and waveforms 1605 associated with the mirror states 1600 to mitigate dielectric charging utilizing reverse-polarity. As described above, applying an electric field across a dielectric will cause dielectric charge trapping that does not easily dissipate. The trapped charge can affect the performance of the micromirror because the trapped charge reduces the separating force. As a result, stiction may occur because the separating force does not overcome surface adhesion forces. Stiction is prevented by utilizing reverse-polarity.

The micromirror includes the following mirror states 1600: latch state 1608, address load state 1610, block stepped address (BSA) step-up state 1615, reset state 1620, offset state 1625, bias state 1630, BSA step-down and discharge state 1635, and latch state 1640. The latch state 1608, the BSA step-down and discharge state 1635, and the latch state 1640 are the landing positions. The address load state 1610, the BSA step-up state 1615, the reset state 1620, the offset state 1625, and the bias state 1630 are reset positions. The micromirror includes a mirror 1645, a first electrode 1650, and a second electrode 1655 that are controlled by the waveforms 1605. During the reset positions, the mirror 1645 tilts towards the landed side. During the landing positions, the mirror 1645 is tilted towards the landed side. A MBRST signal 1660 provides voltage to the mirror 1645. As described in FIG. 1, the MBRST signal 1660 is generated by transitioning the voltage of the mirror 1645 by altering the voltage of the electrodes 1650 and 1655. A first signal 1665 provides voltage to the first electrode 1650. A second signal 1670 provides voltage to the second electrode 1655. The first signal 1665 and the second signal 1670 are created from the CMOS signal described in FIG. 2. As described in FIG. 1, the CMOS signal is generated at a block level. The first signal 1665 or the second signal 1670 provides voltage based on a mirror position stored in the memory cell described in FIG. 2. For example, in cases where the mirror position stored in the memory cell indicates the mirror 1645 is to tilt towards the side associated with the second electrode 1655, the first signal 1665 provides voltage to the first electrode 1650 beginning at the address load state 1610 state.

The MBRST signal 1660, the first signal 1665, and the second signal 1670 are at different voltage levels based on the power sources supplied by a driver described in FIG. 1. In this example, the power sources include a bias voltage (Vb) 1675, a stepped high voltage (Vcc2) 1677, a power supply voltage (Vcc) 1680, a ground voltage 1683, a reset voltage (Vr) 1685, and a discharge voltage (Vdch) 1688. In one example, Vb 1675 is 18 volts (V); Vcc2 1677 is 10 V; Vcc 1680 is between 1.8 V to 0 V; ground voltage 1683 is 0 V; Vr 1685 is −14 V; Vdch 1688 is −18 V. However, other voltages may be used.

The latch state 1608 includes the MBRST signal 1660 providing Vb 1675 to the mirror 1645 and the second signal 1670 providing Vcc 1680 to the second electrode 1655. The MBRST signal 1660 is a sequential example implementation of the states 1608-1640 of the mirror states 1600, such that the mirror 1645 changes the orientation of the tilt (e.g., the landed pad switches from the first electrode 1650 to the second electrode 1655). Alternatively, the mirrors may be controlled to operate in any other configuration, orientation, position, and/or, more generally, in any other state or order of states than described herein. The address load state 1610 includes the MBRST signal 1660 providing Vb 1675 to the mirror 1645 and the first signal 1665 providing Vcc 1680 to the first electrode 1650. The BSA step-up state 1615 includes the MBRST signal 1660 providing Vb 1675 to the mirror 1645 and the first signal 1665 providing Vcc2 1677 to the first electrode 1650. The reset state 1620 includes the MBRST signal 1660 providing Vr 1685 to the mirror 1645 and the first signal 1665 providing Vcc2 1677 to the first electrode 1650. The offset state 1625 includes the MBRST signal 1660 providing Vcc2 1677 to the mirror 1645 and the first signal 1665 providing Vcc2 1677 to the first electrode 1650. The bias state 1630 includes the MBRST signal 1660 providing Vb 1675 to the mirror 1645 and the first signal 1665 providing Vcc2 1677 to the first electrode 1650.

The BSA step-down and discharge state 1635 includes the MBRST signal 1660 providing Vdch 1688 to the mirror 1645 and the first signal 1665 providing Vcc 1680 to the first electrode 1650. During the BSA step-down and discharge state 1635 time period, the polarity of the Vb 1675 is reversed to Vdch 1688 which may pull out charge that has been accumulated in the dielectric. The time period for the BSA step-down and discharge state 1635 is long enough to reset the dielectric to the initial state before charge accrual. However, in cases where the BSA step-down and discharge state 1635 continues to occur after the dielectric is reset, charge may begin to accrue on the dielectric of the opposite charge. Further, the time spent during the BSA step-down and discharge state 1635 may not be equal to a time providing positive polarity to the mirror 1645 because of hysteresis and/or varying discharge and charge rates of the dielectric.

As described in FIG. 1, the array of micromirrors 105 on a DMD 110 may be divided into blocks. In cases where a first block of micromirrors are in the BSA step-down and discharge state 1635 time period, the BSA step-down and discharge state 1635 occurs for the DMD 110 to prevent damage of the DMD 110. For example, in cases where a second block of micromirrrors that is adjacent to the first block of micromirrors on the DMD 110 is receiving non-reversed polarity, an attraction between the two blocks occur and could damage the DMD 110.

The latch state 1640 includes the MBRST signal 1660 providing Vb 1675 to the mirror 1645 and the first signal 1665 providing Vcc 1680 to the first electrode 1650. The tilt angle may be slightly different compared to the BSA step-down and discharge state 1635 due to the differences in the potential differences between the mirror 1645 and the first electrode 1650. The transition between the BSA step-down and discharge state 1635 and the latch state 1640 may cause a transient effect (e.g., flutter). The gaps 1690 shown in the waveforms 1605 represent a time gap. For example, the time corresponding to the reset positions (e.g., 2 microseconds) is significantly shorter than the landing positions (e.g., 100 microseconds).

Figure 17:
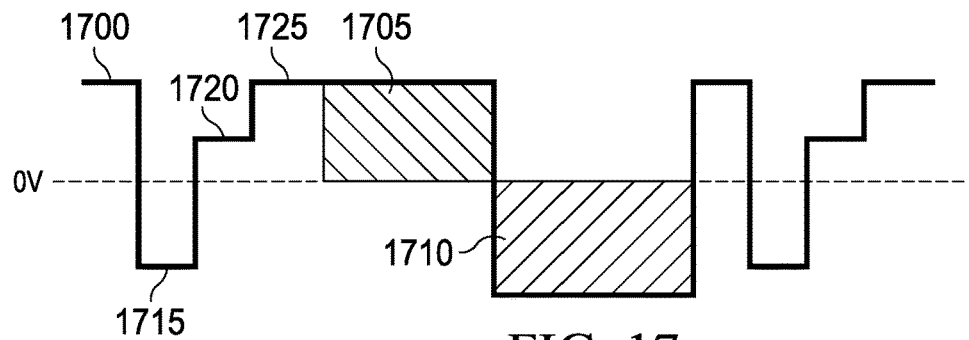
FIG. 17 is a waveform to mitigate dielectric charging utilizing reverse-polarity.

FIG. 17 is a waveform 1700 to mitigate dielectric charging utilizing reverse-polarity. The waveform 1700 is an example of the MBRST signal 1660 of FIG. 16. The waveform 1700 includes a first time period 1705, a second time period 1710, a first example voltage level 1715, a second example voltage level 1720, and a third example voltage level 1725. The first time period 1705 and the second time period 1710 while a mirror of a micromirror is in a landing position as described in FIG. 16. The first time period 1705 may cause charge accumulation in the dielectric of the micromirror due to an electric field. The second time period 1710 may cause charge removal from the dielectric of the micromirror due to the electric field being in a reversed direction.

The first voltage level 1715 is configured to represent the voltage during the reset state 1620 of FIG. 16 and/or approximately the voltage during the BSA step down and discharge state 1635 of FIG. 16. The second voltage level 1720 is configured to represent the voltage during the offset state 1625 of FIG. 16. The third voltage level 1725 is configured to represent the voltage during the latch stage 1608 of FIG. 16, the address load state 1610 of FIG. 16, the BSA step-up state 1615 of FIG. 16, the bias state 1630 of FIG. 16 and/or the latch state 1640 of FIG. 16.

Figure 18:
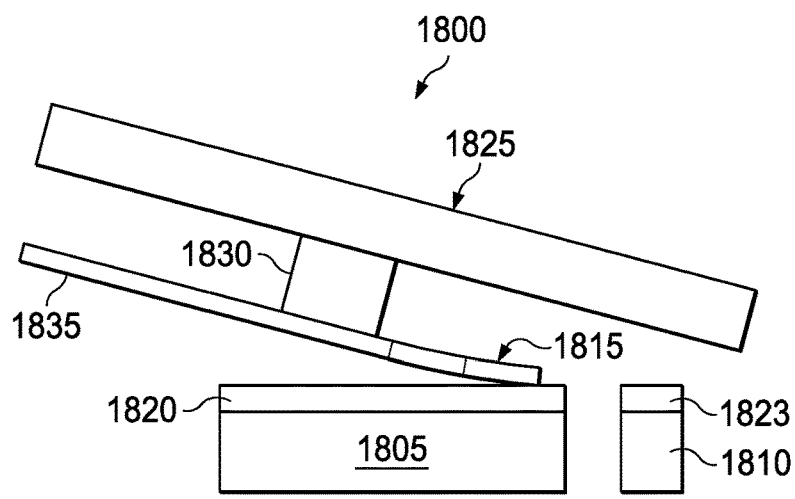
FIG. 18 is an illustration of an example hot-landing micromirror including an inner electrode and an outer latch electrode to mitigate dielectric charging

FIG. 18 is an illustration of an example hot-landing micromirror 1800 including an inner electrode 1805 and an outer latch electrode 1810 to mitigate dielectric charging. The illustration is a side view of a portion of the hot-landing micromirror 1800. The hot-landing micromirror 1800 includes a springtip 1815, the inner electrode 1805 with an inner dielectric coating 1820, the outer latch electrode 1810 with an outer latch dielectric coating 1823, a mirror 1825, a mirror via 1830, and a hinge layer 1835. The inner electrode 1805 may also be referred to as a main address electrode. The portion of the hot-landing micromirror 1800 shows a springtip 1815 compressed against the inner electrode 1805 with an inner dielectric coating 1820. The hinge layer 1835 is comprised of the springtip 1815 a hinge (not pictured).

In some examples, each of the electrodes in FIGS. 3-11 are separated into the inner electrode 1805 and the outer latch electrode 1810, and the dielectric coating in FIGS. 3-11 is separated into the inner dielectric coating 1820 and the outer latch dielectric coating 1823. The inner electrode 1805 and the outer latch electrodes each have a separate dielectric coating. As a result, the hot-landing micromirror 1800 is an example of the first hot-landing micromirror 300 of FIGS. 3-5, the second hot-landing micromirror 600 of FIGS. 6-8, the third hot-landing micromirror 900 of FIG. 9, the fourth hot-landing micromirror 1000 of FIG. 10, and/or the fifth hot-landing micromirror 1100 of FIG. 11.

In one example, the inner electrode 1805 is the on side. As a result, the landing position shown in FIG. 18 corresponds to the mirror 1825 being in an on position because the springtip 1815 is compressed against the inner electrode 1805 associated with the on side. Alternatively, the inner electrode 1805 is the off side. As a result, the landing position shown in FIG. 18 corresponds to the mirror 1825 being in an off position because the springtip 1815 is compressed against the inner electrode 1805 associated with the off side. The mirror 1825 being in an on position or off position is based on voltage signals controlling the hot-landing micromirror 1800. Details of the voltage signals are described in FIG. 20.

In the example of FIG. 18, the outer latch electrode 1810 is set at a voltage that holds the mirror 1825 in the landed state. The outer latch electrode 1810 may be configured to hold the mirror 1825 during a series of states (e.g., the latch state 1608 of FIG. 16, the address load state 1610 of FIG. 16, etc.) where the voltage of the inner electrode 1805 transitions between Vcc 1680 of FIG. 16 and the ground voltage 1683 of FIG. 16, such that the effects of dielectric charge trapping are reduced.

Figure 19:
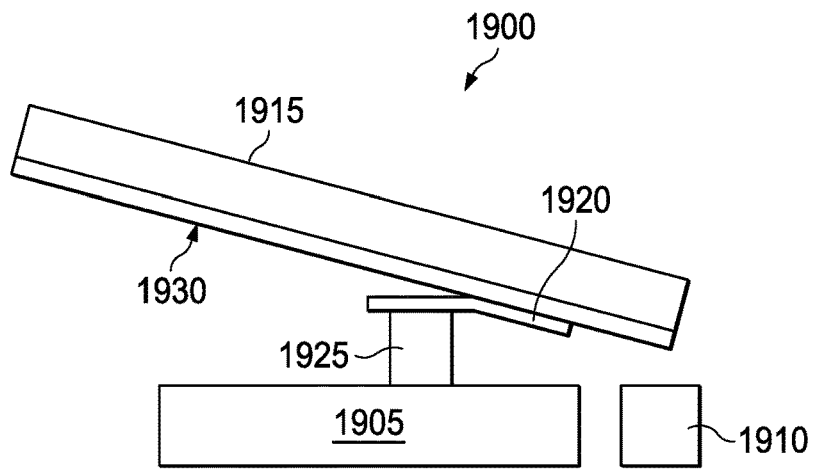
FIG. 19 is an illustration of an example hot-landing micromirror including an inner electrode and an outer latch electrode to mitigate dielectric charging.

FIG. 19 is an illustration of an example hot-landing micromirror 1900 including an inner electrode 1905 and an outer latch electrode 1910 to mitigate dielectric charging. The illustration is a side view of a portion of the hot-landing micromirror 1900. The hot-landing micromirror 1900 includes a mirror 1915, the springtip 1920, the inner electrode 1905, and the outer latch electrode 1910. The inner electrode 1905 may also be referred to as a main address electrode. The inner electrode 1905 is raised by including an electrode post 1925, and the inner electrode 1905 is combined with the springtip 1920. The portion of the hot-landing micromirror 1900 shows a springtip 1920 compressed against the mirror 1915 with a dielectric coating 1930.

In some examples, each of the electrodes in FIGS. 13-15 are separated into the inner electrode 1905 and the outer latch electrode 1910. As a result, the hot-landing micromirror 1900 is an example of the sixth hot-landing micromirror 1300, 1400 of FIGS. 13 and 14.

In one example, the inner electrode 1905 is the on side. As a result, the landing position shown in FIG. 19 corresponds to the mirror 1915 being in an on position because the springtip 1920 combined with the inner electrode 1905 associated with the on side is compressed against the mirror 1915. Alternatively, the inner electrode 1905 is the off side. As a result, the landing position shown in FIG. 19 corresponds to the mirror 1915 being in an off position because the springtip 1920 combined with the inner electrode 1905 associated with the off side is compressed against the mirror 1915. The mirror 1915 being in an on position or off position is based on voltage signals controlling the hot-landing micromirror 1900. Details of the voltage signals are described in FIG. 20.

Figure 20:
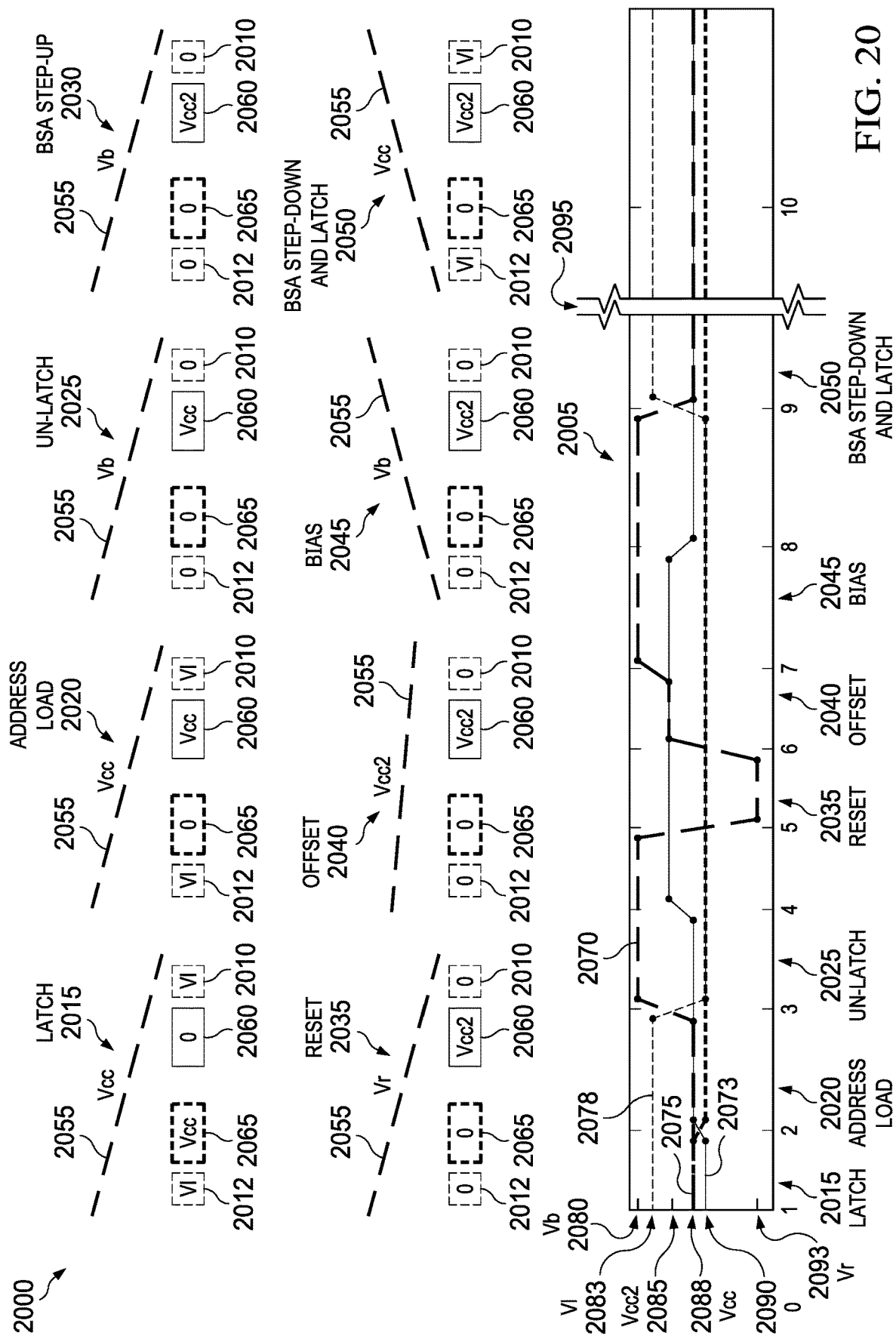
FIG. 20 is an illustration of mirror states and waveforms associated with the mirror states to mitigate dielectric charging utilizing outer latch electrodes.

FIG. 20 is an illustration of mirror states 2000 and waveforms 2005 associated with the mirror states 2000 to mitigate dielectric charging utilizing outer latch electrodes 2010, 2012. As described above, applying an electric field across a dielectric will cause dielectric charge trapping that does not easily dissipate. The trapped charge can affect the performance of the micromirror because the trapped charge reduces the separating force. As a result, stiction may occur because the separating force does not overcome surface adhesion forces. Stiction is prevented by utilizing the outer latch electrodes 2010, 2012.

The micromirror includes the following mirror states 2000: latch state 2015, address load state 2020, un-latch state 2025, BSA step-up state 2030, reset state 2035, offset state 2040, bias state 2045, and BSA step-down and latch state 2050. The latch state 2015 and the BSA step-down and latch state 2050 are landing positions. The address load state 2020, un-latch state 2025, BSA step-up state 2030, reset state 2035, offset state 2040, and bias state 2045 are reset positions. The micromirror includes a mirror 2055, a first electrode 2060, and a second electrode 2065 that are controlled by the waveforms 2005. During the reset positions, the mirror 2055 dynamically moves to the landed side. During the landing positions, the mirror 2055 is tilted towards the landed side. A MBRST signal 2070 provides voltage to the mirror 2055. A first signal 2073 provides voltage to the first electrode 2060. A second signal 2075 provides voltage to the second electrode 2065. A latch signal 2078 provides voltage to the outer latch electrodes 2010, 2012. The first signal 2073 and the second signal 2075 are created from the CMOS signal described in FIG. 2. As described in FIG. 1, the CMOS signal is generated at a block level. The first signal 2073 or the second signal 2075 is provided with a voltage based on a mirror position stored in the memory cell described in FIG. 2. For example, in cases where the mirror position stored in the memory cell indicates the mirror 2055 is to tilt towards the side associated with the second electrode 2065, the first signal 2073 provides voltage to the first electrode 2060 beginning at the address load state 2020.

The MBRST signal 2070, the first signal 2073, the second signal 2075, and the latch signal 2078 are at voltage levels based on the power sources of a driver described in FIG. 1. In this example, the power sources include a bias voltage (Vb) 2080, a latch voltage (Vl) 2083, a stepped high voltage (Vcc2) 2085, a power supply voltage (Vcc) 2088, a ground voltage 2090, and a voltage reset (Vr) 2093. In one example, Vb 2080 is 18 volts (V); Vl 2083 is 18 V; Vcc2 2085 is 10 V; Vcc 2088 is between 1.8 V to 0 V; ground voltage 2090 is 0 V; and Vr 2093 is −14 V. However, other voltages may be used.

The latch state 2015 includes the MBRST signal 2070 providing Vcc 2088 to the mirror 2055, the second signal 2075 providing Vcc 2088 to the second electrode 2065, and the latch signal 2078 providing Vl 2083 to the outer latch electrodes 2010, 2012. The address load state 2020 includes the MBRST signal 2070 providing Vcc 2088 to the mirror 2055, the first signal 2073 providing Vcc 2088 to the first electrode 2060, and the latch signal 2078 providing Vl 2083 to the outer latch electrodes 2010, 2012. In contrast to the MBRST signal 1660 providing Vb 1675 to the mirror 1645 for the latch state 1608 and the address load state 1610 in FIG. 16, the MBRST signal 2070 provides Vcc 2088 to the mirror 2055 to reduce the charge accumulation of the dielectric associated with the first electrode 2060 caused by the electric field between the first electrode 2060 and the mirror 2055. The electric field is reduced because the potential difference between Vcc 2088 and ground voltage 2090 is lower than the potential difference between Vb 2080 and ground voltage 2090. The mirror 2055 stays in the landing position during the latch state 2015 and address load state 2020 due to the electrostatic force caused by the potential difference between the mirror 2055 and the outer latch electrode 2010.

The un-latch state 2025 includes the MBRST signal 2070 providing Vb 2080 to the mirror 2055 and the first signal 2073 providing Vcc 2088 to the first electrode 2060. The BSA step-up state 2030 includes the MBRST signal 2070 providing Vb 2080 to the mirror 2055 and the first signal 2073 providing Vcc2 2085 to the first electrode 2060. The reset state 2035 includes the MBRST signal 2070 providing Vr 2093 to the mirror 2055 and the first signal 2073 providing Vcc2 2085 to the first electrode 2060. The offset state 2040 includes the MBRST signal 2070 providing Vcc2 2085 to the mirror 2055 and the first signal 2073 providing Vcc2 2085 to the first electrode 2060. The bias state 2045 includes the MBRST signal 2070 providing Vb 2080 to the mirror 2055 and the first signal 2073 providing Vcc2 2085 to the first electrode 2060.

The BSA step-down and latch state 2050 includes the MBRST signal 2070 providing Vcc 2088 to the mirror 2055, the first signal 2073 providing Vcc 2088 to the first electrode 2060, and the latch signal 2078 providing Vl 2083 to the outer latch electrodes 2010, 2012. The mirror 2055 stays in position during BSA step-down and latch 2050 due to the electrostatic force caused by the potential difference between the mirror 2055 and the outer latch electrode 2012. The gap 2095 shown in the waveforms 2005 represent a time gap. For example, the time corresponding to the reset positions (e.g., 2 microseconds) is significantly shorter than the landing positions (e.g., 100 microseconds).

Figure 21:
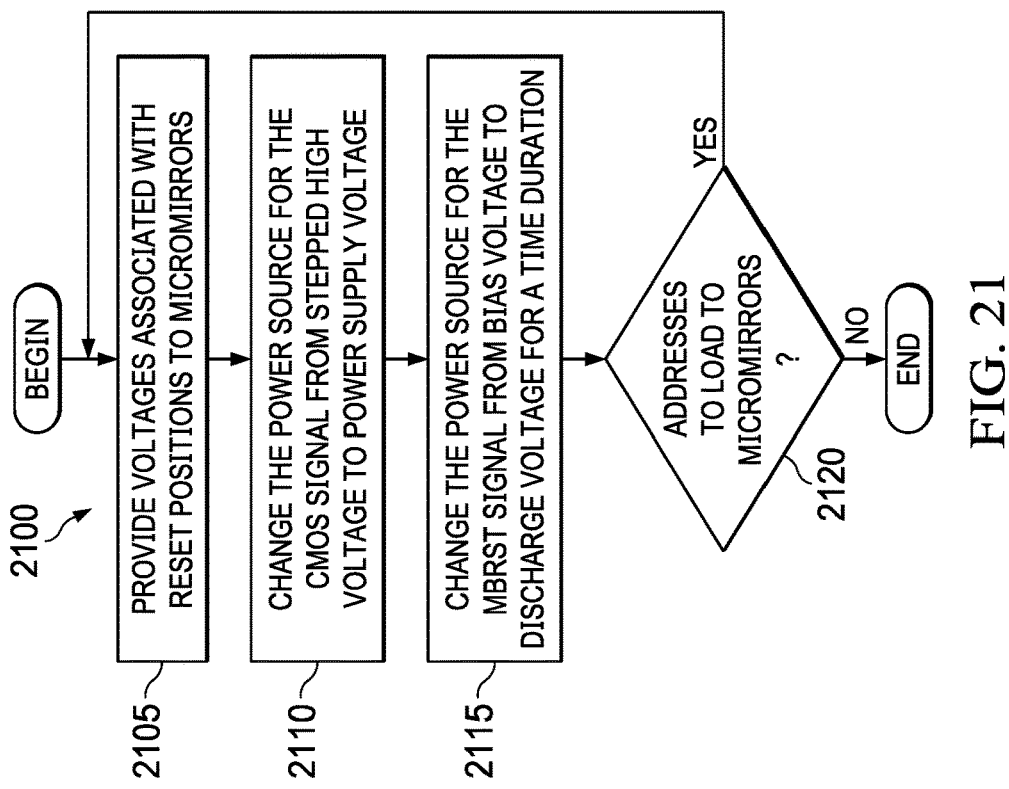
FIG. 21 is a flowchart representative of an example process.

FIG. 21 is a flowchart representative of an example process 2100 that may be performed using configured hardware and/or machine-readable instructions that may be executed by a processor to implement the driver 120 of FIG. 1 providing voltages to micromirrors.

The example process 2100 begins at block 2105, at which the driver 120 provides voltages associated with reset positions to micromirrors. The micromirrors may implement the array of micromirrors 105 in FIG. 1. For example, the driver 120 provides first voltages to the first block 140 of micromirrors and second voltages to the second block 150 of micromirrors. As described in FIG. 16, the reset positions include mirror states of the micromirrors where the mirrors associated with each of the micromirrors are moving to the landed side. The landed side for each of the micromirrors is based on the mirror positions stored in the memory cells corresponding to the micromirrors. The first voltages and the second voltages may correspond to a portion of the waveforms 1605 during the reset positions.

At block 2110, the driver 120 changes the power source for the CMOS signal from stepped high voltage to power supply voltage. For example, the CMOS signal creates the first signal 1665 and the second signal 1670 to provide voltages associated with a landing position for the first electrode 1650 or the second electrode 1655. The landing position is based on the mirror position stored in the memory cell described in FIG. 16. The stepped high voltage may correspond to Vcc2 1677, and the power supply voltage may correspond to Vcc 1680.

At block 2115, the driver 120 changes the power source for the MBRST signal from bias voltage to discharge voltage for a time duration. For example, the MBRST signal implements the MBRST signal 1660 of FIG. 16 and/or the waveform 1700 of FIG. 17. The bias voltage may correspond to Vb 1675 of FIG. 16, and the discharge voltage may correspond to Vdch 1688 of FIG. 16. Vdch 1688 of FIG. 16 has a reversed polarity compared to Vb 1675. Providing the reversed polarity may pull out charge accumulated in the dielectric. The dielectric may implement the dielectric coating 1210 of FIG. 12. The time duration may correspond to the second time period 1710 of FIG. 17 and associated with landing positions.

At block 2120, the driver 120 determines whether addresses are to be loaded to the micromirrors. The micromirrors may implement the array of micromirrors 105 in FIG. 1. If the driver 120 determines addresses are to be loaded to the micromirrors (e.g., block 2120 returns a result of "YES"), the driver 120 returns to block 2105. If the driver 120 determines addresses are not to be loaded to the micromirrors (e.g., block 2120 returns a result of "NO"), the example process of 2100 terminates.

Figure 22:
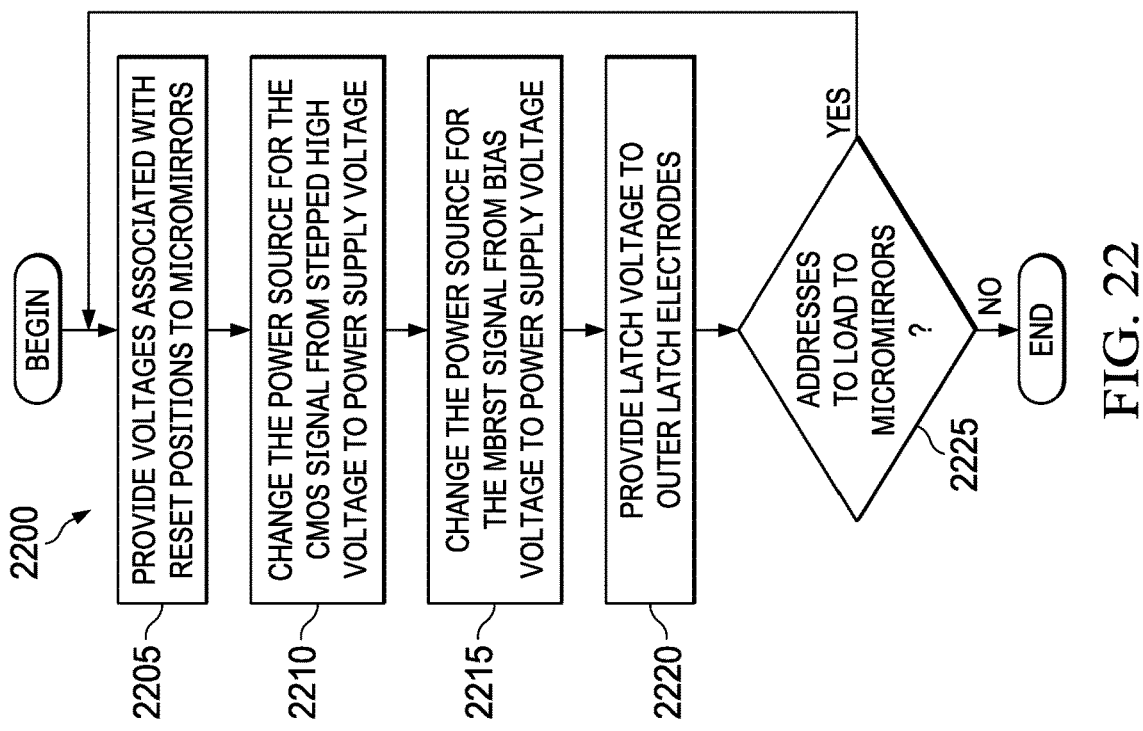
FIG. 22 is a flowchart representative of an example process.

FIG. 22 is a flowchart representative of an example process 2200 that may be performed using configured hardware and/or machine-readable instructions that may be executed by a processor to implement the driver 120 of FIG. 1 providing voltages to micromirrors. The micromirrors include electrodes separated into an inner electrode and an outer latch electrode as described in FIGS. 18 and 19.

The example process 2200 begins at block 2205, at which the driver 120 provides voltages associated with reset positions to micromirrors. The micromirrors may implement the array of micromirrors 105 in FIG. 1 including electrodes separated into an inner electrode and an outer latch electrode. For example, the driver 120 provides first voltages to the first block 140 of micromirrors and second voltages to the second block 150 of micromirrors. As described in FIG. 16, the reset positions include mirror states of the micromirrors where the mirrors associated with each of the micromirrors are moving to the landed side. The landed side for each of the micromirrors is based on the mirror positions stored in the memory cells corresponding to the micromirrors. The first voltages and the second voltages may correspond to a portion of the waveforms 2005 during the reset positions.

At block 2210, the driver 120 changes the power source for the CMOS signal from stepped high voltage to power supply voltage. For example, the CMOS signal creates the first signal 2073 and the second signal 2075 to provide voltages for the first electrode 2060 or the second electrode 2065 based on the mirror position stored in the memory cell described in FIG. 20. The stepped high voltage may correspond to Vcc2 2085, and the power supply voltage may correspond to Vcc 2088.

At block 2215, the driver 120 changes the power source for the MBRST signal from bias voltage to power supply voltage. For example, the MBRST signal implements the MBRST signal 2070 of FIG. 20. The bias voltage may correspond to Vb 2080, and the power supply voltage may correspond to Vcc 2088. The MBRST signal 2070 may provide Vcc 2088 to reduce the charge accumulation of the dielectric associated with the first electrode 2060 caused by the electric field between the first electrode 2060 and the mirror 2055.

At block 2220, the driver 120 provides latch voltage to outer latch electrodes. For example, the latch voltage is provided by the latch signal 2078 of FIG. 20. The latch voltage may correspond to Vl 2083. The outer latch electrodes may implement the outer latch electrodes 2010, 2012 of FIG. 20. The potential difference between the mirror 2055 and the electrode associated with the landed side (e.g., the outer latch electrode 2010 or the outer latch electrode 2012) causes the mirror 2055 to stay in the landing position.

At block 2225, the driver 120 determines whether addresses are to be loaded to the micromirrors. The micromirrors may implement the array of micromirrors 105 in FIG. 1 including electrodes separated into an inner electrode and an outer latch electrode described in FIGS. 18 and 19. If the driver 120 determines addresses are to be loaded to the micromirrors (e.g., block 2225 returns a result of "YES"), the driver 120 returns to block 2205. If the driver 120 determines addresses are not to be loaded to the micromirrors (e.g., block 2225 returns a result of "NO"), the example process of 2205 terminates.

Figure 23:
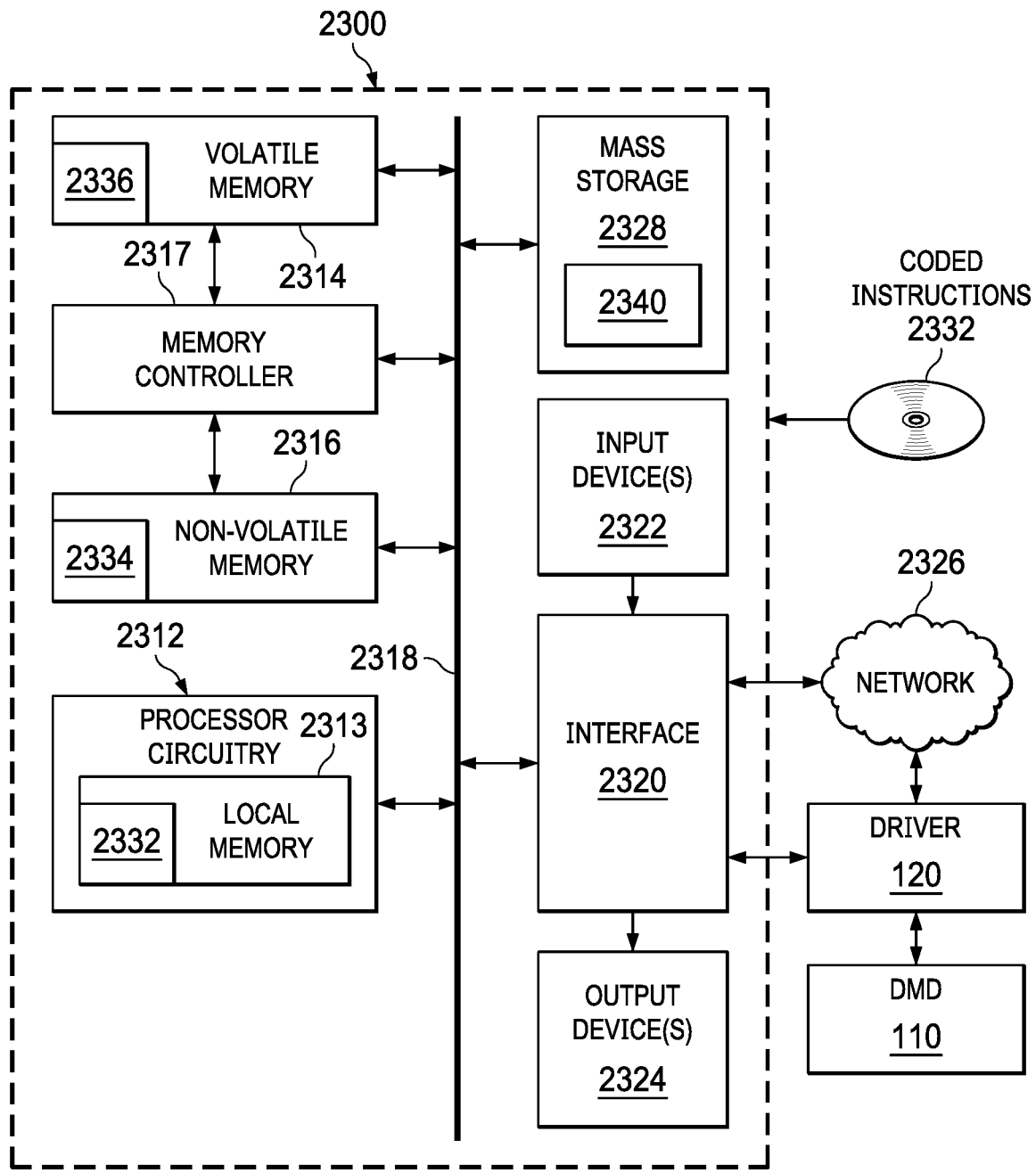
FIG. 23 is a block diagram of an example processing platform including processor circuitry structured to execute the example machine readable instructions of FIGS. 21-22 to implement the display device of FIG. 1.

FIG. 23 is a block diagram of an example processor platform 2300 structured to execute and/or instantiate the machine readable instructions and/or operations of FIGS. 21 and 22 to implement the display system of FIG. 1. The processor platform 2300 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a digital video disc (DVD) player, a compact disc (CD) player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 2300 of the illustrated example includes processor circuitry 2312. The processor circuitry 2312 of the illustrated example is hardware. For example, the processor circuitry 2312 can be implemented by one or more integrated circuits, logic circuits, FPGAs microprocessors, CPUs, graphics processing units (GPUs), DSPs, and/or microcontrollers from any desired family or manufacturer. The processor circuitry 2312 may be implemented by one or more semiconductor based (e.g., silicon based) devices. In some examples, the driver 120 is processor circuitry 2312, which may be at least one of an FPGA, a programmable processor, etc. In this example, the processor circuitry 2312 is separate of the driver 120.

The processor circuitry 2312 of the illustrated example includes a local memory 2313 (e.g., a cache, registers, etc.). The processor circuitry 2312 of the illustrated example is in communication with a main memory including a volatile memory 2314 and a non-volatile memory 2316 by a bus 2318. The volatile memory 2314 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 2316 may be implemented by flash memory and/or any other desired type of memory device. Access to the main memory 2314, 2316 of the illustrated example is controlled by a memory controller 2317.

The processor platform 2300 of the illustrated example also includes interface circuitry 2320. The interface circuitry 2320 may be implemented by hardware in accordance with any type of interface standard, such as an Ethernet interface, a universal serial bus (USB) interface, a Bluetooth® interface, a near field communication (NFC) interface, a peripheral component interconnect (PCI) interface, and/or a peripheral component interconnect express (PCIe) interface.

In the illustrated example, one or more input devices 2322 are connected to the interface circuitry 2320. The input device(s) 2322 permit(s) a user to enter data and/or commands into the processor circuitry 2312. The input device(s) 2322 can be implemented by, for example, an audio sensor, a microphone, a camera (still or video), a keyboard, a button, a mouse, a touchscreen, a track-pad, a trackball, an isopoint device, and/or a voice recognition system.

One or more output devices 2324 are also connected to the interface circuitry 2320 of the illustrated example. The output devices 2324 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 2320 of the illustrated example, thus, typically includes a graphics driver card, a graphics driver chip, and/or graphics processor circuitry such as a GPU.

The interface circuitry 2320 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 2326. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 2300 of the illustrated example also includes one or more mass storage devices 2328 to store software and/or data. Examples of such mass storage devices 2328 include magnetic storage devices, optical storage devices, floppy disk drives, HDDs, CDs, Blu-ray disk drives, redundant array of independent disks (RAID) systems, solid state storage devices such as flash memory devices, and DVD drives.

The machine executable instructions 2332, 2334, 2336, 2340 which may be implemented by the machine readable instructions of FIGS. 21 and 22 may be stored in the mass storage device 2328, in the volatile memory 2314, in the non-volatile memory 2316, and/or on a removable non-transitory computer readable storage medium such as a CD or DVD.

From the foregoing, it will be appreciated that example systems, methods, and apparatus have been disclosed that prevent stiction by improving electrostatic forces and mitigating dielectric charge trapping. The disclosed systems, methods, and apparatus improve the efficiency of using a computing device by utilizing: a hot-landing and dielectric coating to improve electrostatic forces, reverse-polarity to mitigate dielectric charge trapping, and/or outer latch electrodes to mitigate dielectric charge trapping. The disclosed systems, methods, and apparatus are accordingly directed to one or more improvement(s) in the operation of a machine such as a computer or other electronic and/or mechanical device. Such improvements include stiction prevention during the operation of a DMD.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. A device comprising:
   a mirror;
   a mirror via coupled to the mirror;
   a hinge layer coupled to the mirror via, the hinge layer comprising a springtip associated with a side of the mirror, the springtip associated with a first terminal; and
   an electrode associated with the side of the mirror, the electrode having a dielectric coating configured to contact the springtip, the electrode associated with a second terminal different than the first terminal.

2. The device of claim 1, further comprising:
   mirror vias comprising the mirror via;
   springtips comprising the springtip; and
   electrodes having dielectric coatings, the electrodes comprising the electrode.

3. The device of claim 2, wherein the side is a first side, wherein the mirror vias comprise four mirror vias, wherein the springtips comprise four springtips, wherein the electrodes comprise two electrodes, wherein a first set of the springtips comprises two springtips associated with the first side of the mirror, and wherein a second set of the springtips comprises two springtips associated with a second side of the mirror.

4. The device of claim 2, wherein the side is a first side, wherein the mirror vias comprise two mirror vias, wherein the springtips comprise six springtips, wherein the electrodes comprise two electrodes, wherein a first set of the springtips comprises three springtips associated with the first side of the mirror, wherein a second set of the springtips comprises three springtips associated with a second side of the mirror.

5. The device of claim 4, further comprising hinge vias coupled to the hinge layer, wherein the hinge vias comprises six hinge vias.

6. The device of claim 4, further comprising hinge vias coupled between the hinge layer and the electrode, wherein the hinge vias comprises a plurality of hinge vias.

7. The device of claim 6, wherein the side is a first side, wherein the mirror vias comprises four mirror vias, wherein the springtips comprise six springtips, wherein the electrodes comprise two electrodes, wherein a first set of the springtips comprises three springtips associated with the first side of the mirror, wherein a second set of the springtips comprises three springtips associated with a second side of the mirror.

8. The device of claim 6, wherein the side is a first side, wherein the mirror vias comprise two mirror vias, wherein the springtips comprise four springtips, wherein the electrodes comprise two electrodes, wherein a first set of the springtips comprises two springtips associated with the first side, and wherein a second set of the springtips comprises two springtips associated with a second side.

9. The device of claim 1, wherein the electrode is a first electrode, wherein the dielectric coating is a first dielectric coating, the device further comprising a second electrode associated with the side, the second electrode having a second dielectric coating, the second electrode associated with a third terminal different than the first terminal and the second terminal.

10. A device comprising:
a mirror having a dielectric coating, the mirror having a side, the mirror associated with a first terminal;
an electrode; and
a springtip configured to contact the dielectric coating of the mirror, the springtip coupled to the electrode, the springtip associated with the side, and the springtip associated with a second terminal different than the first terminal.

11. The device of claim 10, further comprising:
a hinge layer;
a mirror via coupled to the mirror and to the hinge layer; and
a set of electrode posts comprising the electrode.

12. The device of claim 11, wherein the set of electrode posts comprises two electrode posts.

13. The device of claim 10, wherein the electrode is a first electrode, wherein the dielectric coating is a first dielectric coating, the device further comprising a second electrode associated with the side, the second electrode having a second dielectric coating, the second electrode associated with a third terminal different than the first terminal and the second terminal.

14. A display system comprising:
a microelectromechanical systems (MEMS) pixel comprising a mirror; and
a driver coupled to the MEMS pixel, the driver configured to:
provide a first series of voltages associated with a first position of the mirror; and
provide a second series of voltages associated with a second position of the mirror, wherein the second series of voltages comprises a discharge voltage and a bias voltage, the discharge voltage having a reversed polarity opposite of a polarity of the bias voltage.

15. The display system of claim 14, wherein the discharge voltage has the reversed polarity for a first time duration, wherein the MEMS pixel comprises a mirror and an electrode having a dielectric coating, wherein the first series of voltages provide the bias voltage for a second time duration to the mirror to cause charge accumulation in the dielectric coating, wherein the second series of voltages provide the discharge voltage having the reversed polarity of the bias voltage to the mirror for the first time duration to cause charge removal from the dielectric coating.

16. The display system of claim 14, wherein the discharge voltage has the reversed polarity for a first time duration, wherein the MEMS pixel comprises a mirror having a dielectric coating, wherein the first series of voltages provide the bias voltage for a second time duration to the mirror to cause charge accumulation in the dielectric coating, wherein the second series of voltages provide the discharge voltage having the reversed polarity of the bias voltage to the mirror for the first time duration to cause charge removal from the dielectric coating.

17. The display system of claim 14, wherein the MEMS pixel comprises a mirror, wherein the MEMS pixel has two sides, wherein the mirror is tilted towards one of the two sides during the first position, wherein the mirror is moving to one of the two sides during the second position.

18. A display system comprising:
a microelectromechanical systems (MEMS) pixel comprising a first electrode and a second electrode; and
a driver coupled to the MEMS pixel, the driver configured to:
provide first voltages associated with reset positions to the first electrode of the MEMS pixel; and
provide second voltages associated with landing positions to the second electrode the MEMS pixel, wherein the second voltages provide a latch voltage.

19. The display system of claim 18, wherein the first electrode is an inner electrode and the second electrode is an outer electrode, wherein the inner electrode corresponds to a first dielectric coating, wherein the outer latch electrode corresponds to a second dielectric coating, wherein the second voltages provide the latch voltage to the outer electrode.

20. The display system of claim 18, wherein the MEMS pixel comprises a mirror, wherein the MEMS pixel is divided into two sides, wherein the mirror is tilted towards one of the two sides during the landing positions, wherein the mirror is moving to one of the two sides during the reset positions.

* * * * *